(12) United States Patent
Sybesma et al.

(10) Patent No.: US 9,081,537 B2
(45) Date of Patent: Jul. 14, 2015

(54) IDENTIFIER ENCODING SCHEME FOR USE WITH MULTI-PATH CONNECTORS

(75) Inventors: Eric W. Sybesma, Minneapolis, MN (US); Jeffrey J. Miller, Shakopee, MN (US)

(73) Assignee: ADC Telecommunications, Inc., Berwyn, PA (US)

(*) Notice: Subject to any disclaimer, the term of this patent is extended or adjusted under 35 U.S.C. 154(b) by 114 days.

(21) Appl. No.: 13/426,794

(22) Filed: Mar. 22, 2012

(65) Prior Publication Data

US 2012/0246351 A1 Sep. 27, 2012

Related U.S. Application Data

(60) Provisional application No. 61/467,729, filed on Mar. 25, 2011.

(51) Int. Cl.
| | |
|---|---|
| G06F 3/00 | (2006.01) |
| G06F 9/00 | (2006.01) |
| G06F 1/16 | (2006.01) |
| H05K 7/00 | (2006.01) |
| H04L 12/933 | (2013.01) |
| H04Q 1/00 | (2006.01) |

(52) U.S. Cl.
CPC .. *G06F 1/16* (2013.01); *G06F 3/00* (2013.01); *H04L 49/10* (2013.01); *H04Q 1/00* (2013.01); *H05K 7/00* (2013.01)

(58) Field of Classification Search
None
See application file for complete search history.

(56) References Cited

U.S. PATENT DOCUMENTS

| | | |
|---|---|---|
| 5,052,940 A | 10/1991 | Bengal |
| 5,161,988 A | 11/1992 | Krupka |
| 5,195,902 A | 3/1993 | Bengal |

(Continued)

FOREIGN PATENT DOCUMENTS

| | | |
|---|---|---|
| EP | 1569494 | 8/2005 |
| JP | 11162570 | 6/1999 |

(Continued)

OTHER PUBLICATIONS

"IntelliMAC", May 2003, pp. 16, Publisher: Nordx/CDT.

(Continued)

*Primary Examiner* — Michael Sun
(74) *Attorney, Agent, or Firm* — Fogg & Powers LLC

(57) ABSTRACT

One exemplary embodiment is directed to a method of tracking a plurality of communication paths in a connector assembly having a plurality of first attachment points and a plurality of second attachment points. The plurality of first attachment points and the plurality of second attachment points are configured to attach physical communication media to the connector assembly. The method comprises reading, from a storage device associated with the connector assembly first, information indicative of a plurality of communication paths formed within the connector assembly between the first attachment points and the second attachment points. The method further comprises reading second information stored on or in physical communication media that is attached to the connector assembly and communicating the first and second information to an aggregation point that is communicatively coupled to the connector assembly.

28 Claims, 12 Drawing Sheets

(56) References Cited

U.S. PATENT DOCUMENTS

| | | | |
|---|---|---|---|
| 5,280,251 A | 1/1994 | Strangio | |
| 5,386,567 A | 1/1995 | Lien et al. | |
| 5,394,503 A | 2/1995 | Dietz, Jr. et al. | |
| 5,418,334 A | 5/1995 | Williams | |
| 5,420,512 A | 5/1995 | Spillane et al. | |
| 5,448,675 A | 9/1995 | Leone et al. | |
| 5,461,693 A | 10/1995 | Pimpinella | |
| 5,463,706 A | 10/1995 | Dumont et al. | |
| 5,473,715 A | 12/1995 | Schofield et al. | |
| 5,483,467 A | 1/1996 | Krupka et al. | |
| 5,487,666 A | 1/1996 | DiGiovanni | |
| 5,541,586 A | 7/1996 | Wise | |
| 5,550,755 A | 8/1996 | Martin et al. | |
| 5,606,664 A | 2/1997 | Brown et al. | |
| 5,619,496 A * | 4/1997 | Weir | 370/363 |
| 5,625,777 A | 4/1997 | Takahashi et al. | |
| 5,764,043 A | 6/1998 | Czosnowski et al. | |
| 5,832,071 A | 11/1998 | Voelker | |
| 5,854,824 A | 12/1998 | Bengal et al. | |
| 5,876,240 A | 3/1999 | Derstine et al. | |
| 5,886,531 A | 3/1999 | Delcourt et al. | |
| 6,002,331 A | 12/1999 | Laor | |
| 6,115,393 A | 9/2000 | Engel et al. | |
| 6,222,908 B1 | 4/2001 | Bartolutti et al. | |
| 6,234,830 B1 | 5/2001 | Ensz et al. | |
| 6,238,235 B1 | 5/2001 | Shavit et al. | |
| 6,243,510 B1 * | 6/2001 | Rauch | 385/15 |
| 6,285,293 B1 | 9/2001 | German et al. | |
| 6,300,877 B1 | 10/2001 | Schannach et al. | |
| 6,330,307 B1 | 12/2001 | Bloch et al. | |
| 6,350,148 B1 | 2/2002 | Bartolutti et al. | |
| 6,359,859 B1 | 3/2002 | Brolin et al. | |
| 6,421,337 B1 | 7/2002 | Rao et al. | |
| 6,424,710 B1 | 7/2002 | Bartolutti et al. | |
| 6,499,861 B1 | 12/2002 | German et al. | |
| 6,522,737 B1 | 2/2003 | Bartolutti et al. | |
| 6,574,586 B1 | 6/2003 | David et al. | |
| 6,577,243 B1 | 6/2003 | Dannenmann et al. | |
| 6,577,595 B1 | 6/2003 | Counterman | |
| 6,636,152 B2 | 10/2003 | Schannach et al. | |
| 6,684,179 B1 | 1/2004 | David | |
| 6,701,192 B1 | 3/2004 | Herwig | |
| 6,725,177 B2 | 4/2004 | David et al. | |
| 6,862,609 B2 | 3/2005 | Merkey | |
| D510,068 S | 9/2005 | Haggay et al. | |
| 6,961,675 B2 | 11/2005 | David | |
| 6,968,994 B1 | 11/2005 | Ashwood Smith | |
| 6,976,867 B2 | 12/2005 | Navarro et al. | |
| 6,983,095 B2 * | 1/2006 | Reagan et al. | 385/135 |
| 7,000,042 B1 * | 2/2006 | Burns et al. | 710/104 |
| 7,038,135 B1 | 5/2006 | Chan et al. | |
| 7,042,562 B2 | 5/2006 | Kiani et al. | |
| 7,077,710 B2 | 7/2006 | Haggay et al. | |
| 7,081,808 B2 | 7/2006 | Colombo et al. | |
| 7,123,810 B2 | 10/2006 | Parrish | |
| 7,143,227 B2 | 11/2006 | Maine | |
| 7,153,142 B2 | 12/2006 | Shifris et al. | |
| 7,160,143 B2 | 1/2007 | David et al. | |
| 7,193,422 B2 | 3/2007 | Velleca et al. | |
| 7,226,217 B1 | 6/2007 | Benton et al. | |
| 7,229,020 B2 | 6/2007 | Goodison et al. | |
| 7,234,944 B2 | 6/2007 | Nordin et al. | |
| 7,289,334 B2 | 10/2007 | Behrens et al. | |
| 7,297,018 B2 | 11/2007 | Caveney et al. | |
| 7,312,715 B2 | 12/2007 | Shalts et al. | |
| D559,186 S | 1/2008 | Kelmer | |
| 7,315,224 B2 | 1/2008 | Gurovich et al. | |
| D564,966 S | 3/2008 | Shifris | |
| 7,352,289 B1 | 4/2008 | Harris | |
| 7,377,819 B1 | 5/2008 | Cooper et al. | |
| 7,401,985 B2 | 7/2008 | Aronson et al. | |
| D575,743 S | 8/2008 | Shifris et al. | |
| 7,411,405 B2 | 8/2008 | Nordin | |
| 7,445,389 B2 | 11/2008 | Aronson | |
| 7,455,527 B2 | 11/2008 | Nordin et al. | |
| 7,468,669 B1 | 12/2008 | Beck et al. | |
| 7,479,032 B2 | 1/2009 | Hoath et al. | |
| 7,499,616 B2 | 3/2009 | Aronson et al. | |
| 7,517,243 B2 | 4/2009 | Caveney et al. | |
| 7,540,667 B2 | 6/2009 | Murano | |
| 7,551,456 B2 | 6/2009 | Behrens et al. | |
| 7,564,795 B2 | 7/2009 | Stephenson et al. | |
| 7,587,590 B2 | 9/2009 | Yamada et al. | |
| 7,684,416 B2 * | 3/2010 | Galin et al. | 370/401 |
| 7,804,700 B2 | 9/2010 | Yamada et al. | |
| 7,811,119 B2 * | 10/2010 | Caveney et al. | 439/489 |
| 7,881,675 B1 | 2/2011 | Gazdzinski | |
| 7,979,613 B2 | 7/2011 | Zohar et al. | |
| 8,027,364 B2 | 9/2011 | Becattini et al. | |
| 8,346,919 B1 | 1/2013 | Eiriksson et al. | |
| 8,578,067 B2 | 11/2013 | Diab | |
| 2001/0043573 A1 | 11/2001 | Kelly | |
| 2002/0071394 A1 * | 6/2002 | Koziy et al. | 370/248 |
| 2002/0191602 A1 | 12/2002 | Woodring et al. | |
| 2002/0194426 A1 * | 12/2002 | Obara et al. | 711/114 |
| 2003/0037132 A1 | 2/2003 | Abdollahi et al. | |
| 2003/0097481 A1 | 5/2003 | Richter | |
| 2003/0112802 A1 | 6/2003 | Ono et al. | |
| 2003/0120915 A1 | 6/2003 | Kleinsteiber et al. | |
| 2005/0097243 A1 * | 5/2005 | Yamashita et al. | 710/38 |
| 2005/0114473 A1 | 5/2005 | Guy et al. | |
| 2005/0164548 A1 | 7/2005 | Spears et al. | |
| 2005/0186819 A1 | 8/2005 | Velleca et al. | |
| 2005/0190768 A1 | 9/2005 | Cutler | |
| 2006/0050630 A1 * | 3/2006 | Kobayashi et al. | 370/216 |
| 2006/0059293 A1 | 3/2006 | Wurzburg et al. | |
| 2006/0123119 A1 | 6/2006 | Hill et al. | |
| 2006/0160395 A1 | 7/2006 | Macauley et al. | |
| 2006/0160396 A1 | 7/2006 | Macauley et al. | |
| 2006/0179144 A1 | 8/2006 | Nagase | |
| 2006/0203715 A1 | 9/2006 | Hunter et al. | |
| 2006/0220533 A1 * | 10/2006 | Achiwa et al. | 313/504 |
| 2006/0227759 A1 | 10/2006 | Bohm et al. | |
| 2006/0268507 A1 | 11/2006 | Takahashi | |
| 2007/0025306 A1 | 2/2007 | Cox et al. | |
| 2007/0042637 A1 * | 2/2007 | Bell et al. | 439/502 |
| 2007/0058338 A1 | 3/2007 | Lee | |
| 2007/0115850 A1 | 5/2007 | Tsuchiya et al. | |
| 2007/0117444 A1 | 5/2007 | Caveney et al. | |
| 2007/0162954 A1 | 7/2007 | Pela | |
| 2007/0230452 A1 | 10/2007 | Hough et al. | |
| 2007/0238343 A1 | 10/2007 | Velleca et al. | |
| 2007/0245033 A1 | 10/2007 | Gavrilescu et al. | |
| 2007/0274234 A1 | 11/2007 | Kubota | |
| 2008/0013457 A1 | 1/2008 | Berman et al. | |
| 2008/0077656 A1 | 3/2008 | Broda | |
| 2008/0133986 A1 | 6/2008 | Vainsencher et al. | |
| 2008/0225853 A1 | 9/2008 | Melman et al. | |
| 2008/0239944 A1 | 10/2008 | Golla et al. | |
| 2009/0136293 A1 | 5/2009 | Normann | |
| 2010/0049822 A1 | 2/2010 | Davies et al. | |
| 2010/0091790 A1 | 4/2010 | Wasielewski, Jr. et al. | |
| 2010/0127758 A1 | 5/2010 | Hollis | |
| 2010/0150005 A1 | 6/2010 | Gerber et al. | |
| 2010/0211664 A1 * | 8/2010 | Raza et al. | 709/223 |
| 2010/0211665 A1 | 8/2010 | Raza et al. | |
| 2010/0211697 A1 | 8/2010 | Raza et al. | |
| 2010/0215049 A1 | 8/2010 | Raza et al. | |
| 2010/0241748 A1 | 9/2010 | Ansari et al. | |
| 2010/0302754 A1 | 12/2010 | Nordin et al. | |
| 2010/0315942 A1 | 12/2010 | Jackson et al. | |
| 2011/0219147 A1 * | 9/2011 | Diab | 710/8 |
| 2012/0051490 A1 | 3/2012 | Hussain et al. | |
| 2012/0133524 A1 * | 5/2012 | Anderson et al. | 340/815.45 |
| 2012/0185185 A1 | 7/2012 | Bae et al. | |
| 2012/0243554 A1 | 9/2012 | Sybesma et al. | |
| 2012/0246347 A1 | 9/2012 | Sybesma et al. | |

(56) References Cited

U.S. PATENT DOCUMENTS

2012/0246362 A1 9/2012 Anne et al.
2012/0246523 A1 9/2012 Anne et al.

FOREIGN PATENT DOCUMENTS

| JP | 2001297044 | 10/2001 |
|---|---|---|
| KR | 102008017170 | 2/2008 |
| WO | 2010093987 | 8/2010 |

OTHER PUBLICATIONS

Kang et al., "Design and Implementation of Newtwork Management System for Power Line Communication Network", "IEEE International Symposium on Power Line Communications and its Applications (ISPLC 2007)", Mar. 28, 2007, pp. 23-28, Publisher: IEEE.
Meredith, "Managers Missing Point of Intelligent Patching ", "http://searchdatacenter.techtarget.com/news/article/0,289142,sid80_gci1099991,00.html", Jun. 21, 2005, pp. 12, Publisher: SearchDataCenter.com.
Milligan, "Intelligent Patching Systems Carving Out a 'Large' Niche", "http://www.cablinginstall.com/index/display/article-display/207641/articles/cabling-installation-maintenance/volume-12/issue-7/contents/technology/int", Jul. 1, 2004, pp. 16, vol. 12, No. 7, Publisher: Cabling Installation & Maintenance.
Feltgen, "PCT Patent Application PCT/EP2009/009036: Method and Arrangement for Identifying at Least One Object", Dec. 16, 2009, pp. 125, Published in: WO.
International Searching Authority, "International Search Report ", "from Foreign Counterpart of U.S. Appl. No. 13/426,794", Sep. 28, 2012, pp. 110, Published in: WO.
The International Bureau of WIPO, "International Preliminary Report on Patentability", "from PCT Counterpart of U.S. Appl. No. 13/426,794", Oct. 10, 2013, pp. 16, Published in: CH.
U.S. Patent and Trademark Office, "Office Action", "from U.S. Appl. No. 13/426,821", Oct. 25, 2013, pp. 1-66, Published in: US.
The International Bureau of WIPO, "International Preliminary Report on Patentability", "from PCT Counterpart of U.S. Appl. No. 13/426,821", Oct. 10, 2013, pp. 16, Published in: CH.
International Searching Authority, "International Search Report ", "from Foreign Counterpart of U.S. Appl. No. 13/426,821", Oct. 23, 2012, pp. 1-12, Published in: WO.
U.S. Patent and Trademark Office, "Office Action ", "from U.S. Appl. No. 13/426,805", Jan. 2, 2014, pp. 1-22, Published in: US.
International Searching Authority, "International Search Report ", "from Foreign Counterpart of U.S. Application No.", Sep. 28, 2012, pp. 1-9, Published in: WO.
U.S. Patent and Trademark Office, "Office Action", "from U.S. Appl. No. 13/426,777", Oct. 23, 2013, pp. 1-71, Published in: US.
International Searching Authority, "International Search Report ", "from Foreign Counterpart of U.S. Appl. No. 13/426,777", Oct. 29, 2012, pp. 1-12, Published in: WO.
U.S. Patent and Trademark Office, "Office Action", "from U.S. Appl. No. 13/426,764", Aug. 26, 2013, pp. 1-34, Published in: US.
International Searching Authority, "International Search Report", "from Foreign Counterpart of U.S. Appl. No. 13/426,764", Sep. 28, 2012, pp. 1-11, Published in: WO.
Jacobson et al., "TCP Extensions for High Performance", May 1992, pp. 1-38.
Braden, "Extending TCP for Transactions—Concepts", Nov. 1992, pp. 1-39.
Bellovin, "Defending Against Sequence Number Attacks", May 1996, pp. 1-7.
Mathis et al., "TCP Selective Acknowledgment Options", Oct. 1996, pp. 1-13.
Paxson, "Computing TCP's Retransmission Timer", Nov. 2000, pp. 1-9.
Duke et al., "A Roadmap for Transmission Control Protocol (TCP) Specification Documents", Sep. 2006, pp. 1-34.
Allman et al., "TCP Congestion Control", Sep. 2009, pp. 1-19.
Cerf et al., "Specification of Internet Transmission Control Program", Dec. 1974, pp. 1-71.
"Transmission Control Protocol", Sep. 1981, pp. 1-92, Publisher: Information Sciences Institute.
U.S. Patent and Trademark Office, "Final Office Action ", "From U.S. Appl. No. 13/426,764", Feb. 24, 2014, pp. 1-31, Published in: US.
U.S. Patent and Trademark Office, "Office Action", "from U.S. Appl. No. 13/426,821", Apr. 8, 2014, pp. 1-63, Published in: US.
U.S. Patent and Trademark Office, "Office Action", "from U.S. Appl. No. 13/426,777", Apr. 8, 2014, pp. 1-65, Published in: US.
U.S. Patent and Trademark Office, "Notice of Allowance", "from U.S. Appl. No. 13/426,805", Apr. 29, 2014, pp. 1-24, Published in: US.
U.S. Patent and Trademark Office, "Advisory Action", "from U.S. Appl. No. 13/426,764", May 2, 2014, pp. 1-4, Published in: US.
United States Patent and Trademark Office, "Final Office Action", "U.S. Appl. No. 13/426,821", Sep. 10, 2014, pp. 1-50.
U.S. Patent and Trademark Office, "Notice of Allowance and Fee(s) Due", "U.S. Appl. No. 13/426,821", Nov. 19, 2014, pp. 1-8.
European Patent Office, "Extended European Search Report from EP Application No. 12763509.2 mailed Jul. 24, 2014", "from Foreign Counterpart of U.S. Appl. No. 13/426,794", Jul. 24, 2014, pp. 1-5, Published in: EP.
United States Patent and Trademark Office, "Final Office Action", "U.S. Appl. No. 13/426,777", Sep. 9, 2014, pp. 1-51.
U.S. Patent and Trademark Office, "Office Action", "from U.S. Appl. No. 13/426,764", Aug. 8, 2014, pp. 1-35, Published in: US.
Vukmirovic et al., "Software architecture for Smart Metering systems with Virtual Power Plants", "15th IEEE Mediterranean Electrotechnical Conference", Apr. 26-28, 2010, pp. 448-451, Publisher: IEEE.
European Patent Office, "Communication under Rule 71(3) from U.S. Appl. No. 12763509.2", "from Foreign Counterpart to U.S. Appl. No. 13/426,794", Apr. 8, 2015, pp. 1-61, Published in: EP.

\* cited by examiner

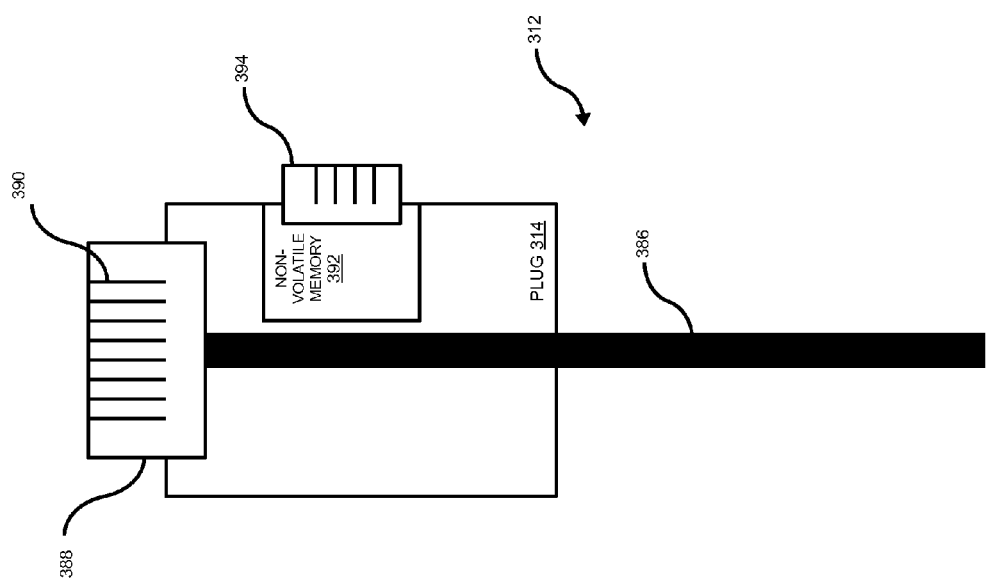

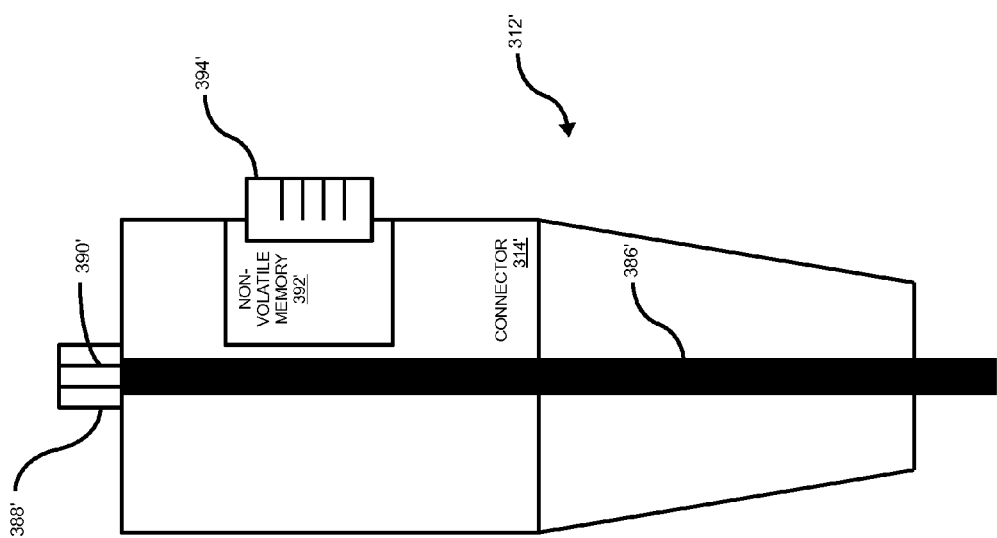

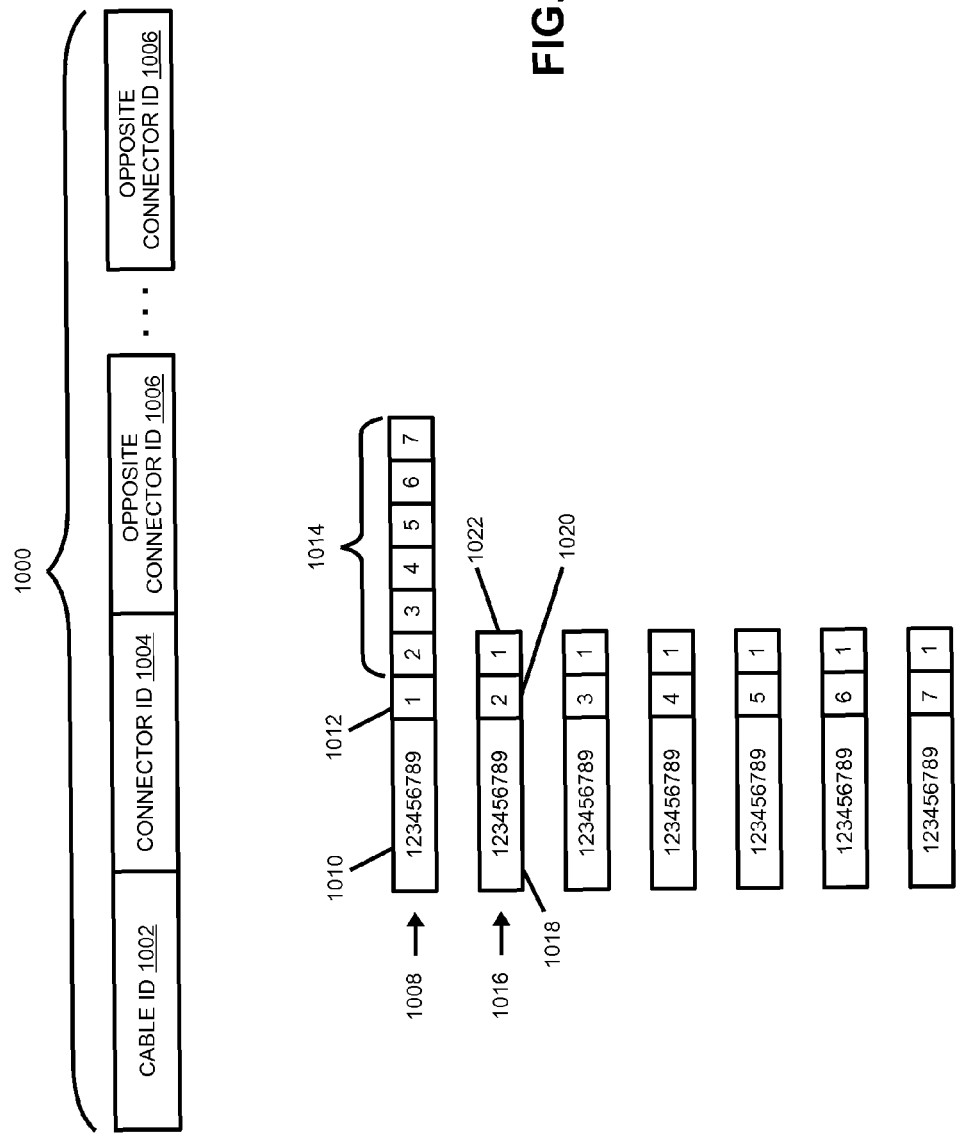

IDENTIFIER ENCODING SCHEME FOR USE WITH MULTI-PATH CONNECTORS

CROSS-REFERENCE TO RELATED APPLICATIONS

This application claims the benefit of U.S. Provisional Patent Application Ser. No. 61/467,729, filed on Mar. 25, 2011, which is hereby incorporated herein by reference.

This application is related to the following:

U.S. Provisional Patent Application Ser. No. 61/467,715, filed on Mar. 25, 2011, titled "DOUBLE-BUFFER INSERTION COUNT STORED IN A DEVICE ATTACHED TO A PHYSICAL LAYER MEDIUM", which is hereby incorporated herein by reference;

U.S. patent application Ser. No. 13/426,821, filed on even date herewith, titled "DOUBLE-BUFFER INSERTION COUNT STORED IN A DEVICE ATTACHED TO A PHYSICAL LAYER MEDIUM", which is hereby incorporated herein by reference;

U.S. Provisional Patent Application Ser. No. 61/467,725, filed on Mar. 25, 2011, titled "DYNAMICALLY DETECTING A DEFECTIVE CONNECTOR AT A PORT", which is hereby incorporated herein by reference;

U.S. patent application Ser. No. 13/426,805, filed on even date herewith, titled "DYNAMICALLY DETECTING A DEFECTIVE CONNECTOR AT A PORT", which is hereby incorporated herein by reference;

U.S. Provisional Patent Application Ser. No. 61/467,736, filed on Mar. 25, 2011, titled "SYSTEMS AND METHODS FOR UTILIZING VARIABLE LENGTH DATA FIELD STORAGE SCHEMES ON PHYSICAL COMMUNICATION MEDIA SEGMENTS", which is hereby incorporated herein by reference;

U.S. patent application Ser. No. 13/426,777, filed on even date herewith, titled "SYSTEMS AND METHODS FOR UTILIZING VARIABLE LENGTH DATA FIELD STORAGE SCHEMES ON PHYSICAL COMMUNICATION MEDIA SEGMENTS", which is hereby incorporated herein by reference;

U.S. Provisional Patent Application Ser. No. 61/467,743, filed on Mar. 25, 2011, titled "EVENT-MONITORING IN A SYSTEM FOR AUTOMATICALLY OBTAINING AND MANAGING PHYSICAL LAYER INFORMATION USING A RELIABLE PACKET-BASED COMMUNICATION", which is hereby incorporated herein by reference; and U.S. patent application Ser. No. 13/426,764, filed on even date herewith, titled "EVENT-MONITORING IN A SYSTEM FOR AUTOMATICALLY OBTAINING AND MANAGING PHYSICAL LAYER INFORMATION USING A RELIABLE PACKET-BASED COMMUNICATION", which is hereby incorporated herein by reference.

BACKGROUND

Communication networks typically include numerous logical communication links between various items of equipment. Often a single logical communication link is implemented using several pieces of physical communication media. For example, a logical communication link between a computer and an inter-networking device such as a hub or router can be implemented as follows. A first cable connects the computer to a jack mounted in a wall. A second cable connects the wall-mounted jack to a port of a patch panel, and a third cable connects the inter-networking device to another port of a patch panel. A "patch cord" cross connects the two together. In other words, a single logical communication link is often implemented using several segments of physical communication media.

A network or enterprise management system (generally referred to here as a "network management system" or "NMS") is typically aware of the logical communication links that exist in a network but typically does not have information about the specific physical layer media that are used to implement the logical communication links. Indeed, NMS systems typically do not have the ability to display or otherwise provide information about how logical communication links are implemented at the physical layer level.

Physical layer management (PLM) systems do exist. However, existing PLM systems are typically designed to facilitate the adding, changing, and removing of cross connections at a particular patch panel or a set of patch panels at a given location. Generally, such PLM systems include functionality to track what is connected to each port of a patch panel, trace connections that are made using a patch panel, and provide visual indications to a user at a patch panel. However, such PLM systems are typically "patch-panel" centric in that they are focused on helping a technician correctly add, change, or remove cross connections at a patch panel. Any "intelligence" included in or coupled to the patch panel is typically only designed to facilitate making accurate cross connections at the patch panel and troubleshooting related problems (for example, by detecting whether a patch cord is inserted into a given port and/or by determining which ports are coupled to one another using a patch cord).

Moreover, any information that such PLM systems collect is typically only used within the PLM systems. In other words, the collections of information that such PLM systems maintain are logical "islands" that are not used at the application-layer level by other systems. Though such PLM systems are sometimes connected to other networks (for example, connected to local area networks or the Internet), such network connections are typically only used to enable a user to remotely access the PLM systems. That is, a user remotely accesses the PLM-related application-layer functionality that resides in the PLM system itself using the external network connection but external systems or networks typically do not themselves include any application-layer functionality that makes use of any of the physical-layer-related information that resides in the PLM system.

SUMMARY

One exemplary embodiment is directed to a method of tracking a plurality of communication paths in a connector assembly having a plurality of first attachment points and a plurality of second attachment points. The plurality of first attachment points and the plurality of second attachment points are configured to attach physical communication media to the connector assembly. The method comprises reading, from a storage device associated with the connector assembly first, information indicative of a plurality of communication paths formed within the connector assembly between the first attachment points and the second attachment points. The method further comprises reading second information stored on or in physical communication media that is attached to the connector assembly and communicating the first and second information to an aggregation point that is communicatively coupled to the connector assembly.

DRAWINGS

FIGS. 3A-3B are diagrams illustrating exemplary embodiments of patch cords.

FIG. 10 illustrates one example of a scheme for tracking the communication paths that exist within the fiber cable of FIG. 9.

Like reference numbers in the various figures indicate like elements.

DETAILED DESCRIPTION

Figure 1:
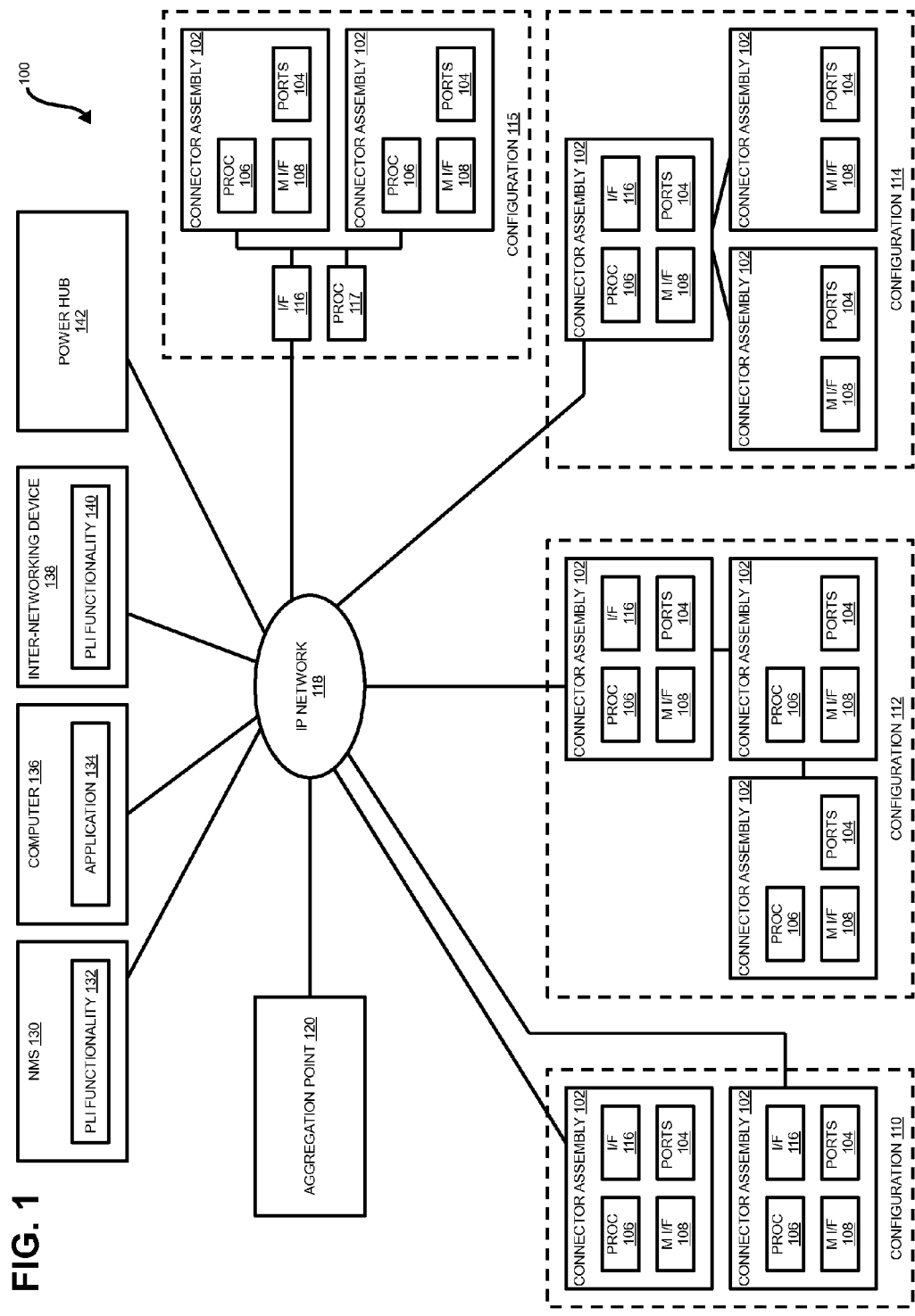
FIG. 1 is a block diagram of one exemplary embodiment of a system that includes physical layer information (PLI) functionality as well as physical layer management (PLM) functionality.

FIG. 1 is a block diagram of one embodiment of a system 100 that includes physical layer information (PLI) functionality as well as physical layer management (PLM) functionality. The system 100 comprises a plurality of connector assemblies 102, where each connector assembly 102 comprises one or more ports 104. In general, the connector assemblies 102 are used to attach segments of physical communication media to one another.

Each segment of physical communication media is attached to a respective port 104. Each port 104 is used to connect two or more segments of physical communication media to one another (for example, to implement a portion of a logical communication link). Examples of connector assemblies 102 include, for example, rack-mounted connector assemblies (such as patch panels, distribution units, and media converters for fiber and copper physical communication media), wall-mounted connector assemblies (such as boxes, jacks, outlets, and media converters for fiber and copper physical communication media), and inter-networking devices (such as switches, routers, hubs, repeaters, gateways, and access points).

At least some of the connector assemblies 102 are designed for use with segments of physical communication media that have identifier and attribute information stored in or on them. The identifier and attribute information is stored in or on the segment of physical communication media in a manner that enables the stored information, when the segment is attached to a port 104, to be read by a programmable processor 106 associated with the connector assembly 102. Examples of information that can be stored in or on a segment of physical communication media include, without limitation, an identifier that uniquely identifies that particular segment of physical communication media (similar to an ETHERNET Media Access Control (MAC) address but associated with the physical communication media and/or connector attached to the physical communication media), a part number, a plug or other connector type, a cable or fiber type and length, a serial number, a cable polarity, a date of manufacture, a manufacturing lot number, information about one or more visual attributes of physical communication media or a connector attached to the physical communication media (such as information about the color or shape of the physical communication media or connector or an image of the physical communication media or connector), and other information used by an Enterprise Resource Planning (ERP) system or inventory control system. In other embodiments, alternate or additional data is stored in or on the media segments. For example, testing, media quality, or performance information can be stored in or on the segment of physical communication media. The testing, media quality, or performance information, for example, can be the results of testing that is performed when a particular segment of media is manufactured.

Also, as noted below, in some embodiments, the information stored in or on the segment of physical communication media can be updated. For example, the information stored in or on the segment of physical communication media can be updated to include the results of testing that is performed when a segment of physical media is installed or otherwise checked. In another example, such testing information is supplied to an aggregation point 120 and stored in a data store maintained by the aggregation point 120 (both of which are described below). In another example, the information stored in or on the segment of physical communication media includes a count of the number of times that a connector (not shown) attached to a segment of physical communication media has been inserted into port 104. In such an example, the count stored in or on the segment of physical communication media is updated each time the connector is inserted into port 104. This insertion count value can be used, for example, for warranty purposes (for example, to determine if the connector has been inserted more than the number of times specified in the warranty) or for security purposes (for example, to detect unauthorized insertions of the physical communication media).

In the particular embodiment shown in FIG. 1, each of the ports 104 of the connector assemblies 102 comprises a respective media interface 108 via which the respective programmable processor 106 is able to determine if a physical communication media segment is attached to that port 104 and, if one is, to read the identifier and attribute information stored in or on the attached segment (if such information is stored therein or thereon). The programmable processor 106 associated with each connector assembly 102 is communicatively coupled to each of the media interfaces 108 using a suitable bus or other interconnect (not shown).

In the particular embodiment shown in FIG. 1, four exemplary types of connector assembly configurations are shown. In the first connector assembly configuration 110 shown in FIG. 1, each connector assembly 102 includes its own respective programmable processor 106 and its own respective network interface 116 that is used to communicatively couple that connector assembly 102 to an Internet Protocol (IP) network 118.

In the second type of connector assembly configuration 112, a group of connector assemblies 102 are physically located near each other (for example, in a bay or equipment closet). Each of the connector assemblies 102 in the group includes its own respective programmable processor 106. However, in the second connector assembly configuration 112, some of the connector assemblies 102 (referred to here as "interfaced connector assemblies") include their own respective network interfaces 116 while some of the connector assemblies 102 (referred to here as "non-interfaced connector assemblies") do not. The non-interfaced connector assemblies 102 are communicatively coupled to one or more of the interfaced connector assemblies 102 in the group via local connections. In this way, the non-interfaced connector assemblies 102 are communicatively coupled to the IP network 118 via the network interface 116 included in one or more of the interfaced connector assemblies 102 in the group. In the second type of connector assembly configuration 112, the total number of network interfaces 116 used to couple the connector assemblies 102 to the IP network 118 can be reduced. Moreover, in the particular embodiment shown in FIG. 1, the non-interfaced connector assemblies 102 are connected to the interfaced connector assembly 102 using a daisy chain topology (though other topologies can be used in other implementations and embodiments).

In the third type of connector assembly configuration 114, a group of connector assemblies 102 are physically located near each other (for example, within a bay or equipment closet). Some of the connector assemblies 102 in the group (also referred to here as "master" connector assemblies 102) include both their own programmable processors 106 and network interfaces 116, while some of the connector assemblies 102 (also referred to here as "slave" connector assemblies 102) do not include their own programmable processors 106 or network interfaces 116. Each of the slave connector assemblies 102 is communicatively coupled to one or more of the master connector assemblies 102 in the group via one or more local connections. The programmable processor 106 in each of the master connector assemblies 102 is able to carry out the processing described below for both the master connector assembly 102 of which it is a part and any slave connector assemblies 102 to which the master connector assembly 102 is connected via the local connections. As a result, the cost associated with the slave connector assemblies 102 can be reduced. In the particular embodiment shown in FIG. 1, the slave connector assemblies 102 are connected to a master connector assembly 102 in a star topology (though other topologies can be used in other implementations and embodiments).

Figure 2:
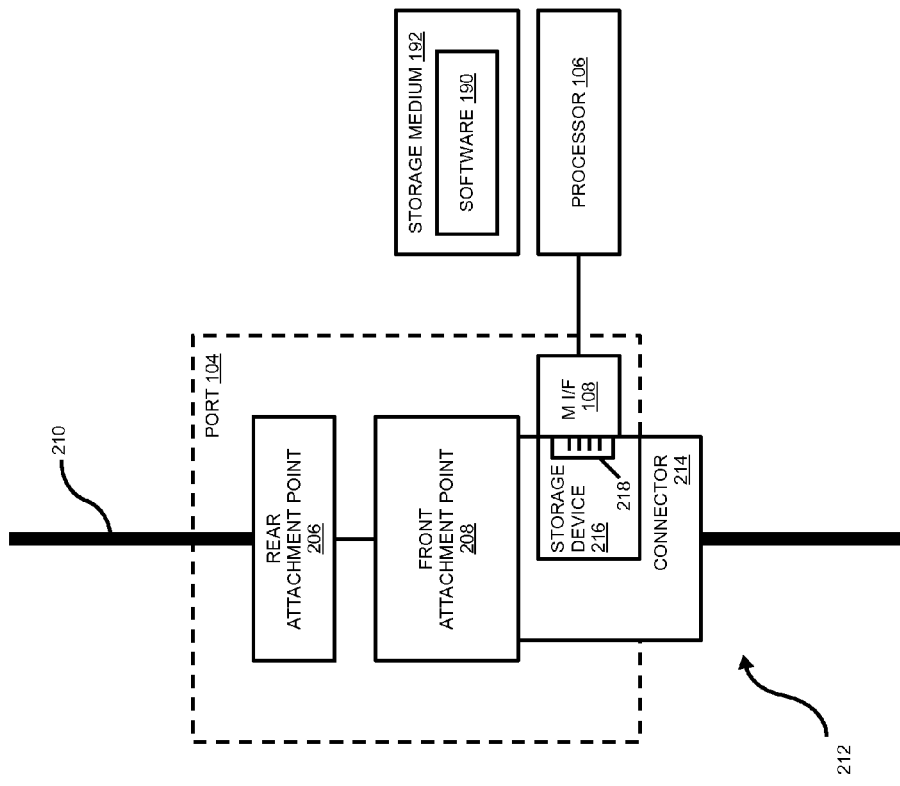
FIG. 2 is a block diagram of one high-level embodiment of a port and media interface that are suitable for use in the system of FIG. 1.

Each programmable processor 106 is configured to execute software or firmware 190 (shown in FIG. 2) that causes the programmable processor 106 to carry out various functions described below. The software 190 comprises program instructions that are stored (or otherwise embodied) on an appropriate non-transitory storage medium or media 192 (such as flash or other non-volatile memory, magnetic disc drives, and/or optical disc drives). At least a portion of the program instructions are read from the storage medium 192 by the programmable processor 106 for execution thereby. The storage medium 192 on or in which the program instructions are embodied is also referred to here as a "program product". Although the storage medium 192 is shown in FIG. 2 as being included in, and local to, the connector assembly 102, it is to be understood that remote storage media (for example, storage media that is accessible over a network or communication link) and/or removable media can also be used. Each connector assembly 102 also includes suitable memory (not shown) that is coupled to the programmable processor 106 for storing program instructions and data. In general, the programmable processor 106 (and the software 190 executing thereon) determines if a physical communication media segment is attached to a port 104 with which that processor 106 is associated and, if one is, to read the identifier and attribute information stored in or on the attached physical communication media segment (if the segment includes such information stored therein or thereon) using the associated media interface 108.

As shown in FIG. 1, in the first, second, and third configurations 110, 112, and 114, each programmable processor 106 is also configured to communicate physical layer information to devices that are coupled to the IP network 118. The physical layer information (PLI) includes information about the connector assemblies 102 associated with that programmable processor 106 (also referred to here as "device information") as well as information about any segments of physical media attached to the ports 104 of those connector assemblies 102 (also referred to here as "media information"). The device information includes, for example, an identifier for each connector assembly, a type identifier that identifies the connector assembly's type, and port priority information that associates a priority level with each port. The media information includes identity and attribute information that the programmable processor 106 has read from attached physical media segments that have identifier and attribute information stored in or on it. The media information may also include information about physical communication media that does not have identifier or attribute information stored in or on it. This latter type of media information can be manually input at the time the associated physical media segments are attached to the connector assembly 102 (for example, using a management application executing on the programmable processor 106 that enables a user to configure and monitor the connector assembly 102).

In the fourth type of connector assembly configuration 115, a group of connector assemblies 102 are housed within a common chassis or other enclosure. Each of the connector assemblies 102 in the configuration 115 includes their own programmable processors 106. In the context of this configuration 115, the programmable processors 106 in each of the connector assemblies are "slave" processors 106. Each of the slave programmable processor 106 is also communicatively coupled to a common "master" programmable processor 117 (for example, over a backplane included in the chassis or enclosure). The master programmable processor 117 is coupled to a network interface 116 that is used to communicatively couple the master programmable processor 117 to the IP network 118. In this configuration 115, each slave programmable processor 106 is configured to determine if physical communication media segments are attached to its port 104 and to read the identifier and attribute information stored in or on the attached physical communication media segments (if the attached segments have such information stored therein or thereon) using the associated media interfaces 108. This information is communicated from the slave programmable processor 106 in each of the connector assemblies 102 in the chassis to the master processor 117. The master processor 117 is configured to handle the processing associated with communicating the physical layer information read from by the slave processors 106 to devices that are coupled to the IP network 118.

The system 100 includes functionality that enables the physical layer information that the connector assemblies 102 capture to be used by application-layer functionality outside of the traditional physical-layer management application domain. That is, the physical layer information is not retained in a PLM "island" used only for PLM purposes but is instead made available to other applications. In the particular embodiment shown in FIG. 1, the system 100 includes an aggregation point 120 that is communicatively coupled to the connector assemblies 102 via the IP network 118.

The aggregation point 120 includes functionality that obtains physical layer information from the connector assemblies 102 (and other devices) and stores the physical layer information in a data store.

The aggregation point 120 can be used to receive physical layer information from various types of connector assemblies 106 that have functionality for automatically reading information stored in or on the segment of physical communication media. Examples of such connector assemblies 106 are noted above. Also, the aggregation point 120 and aggregation functionality 124 can also be used to receive physical layer information from other types of devices that have functionality for automatically reading information stored in or on the segment of physical communication media. Examples of such devices include end-user devices—such as computers, peripherals (such as printers, copiers, storage devices, and scanners), and IP telephones—that include functionality for automatically reading information stored in or on the segment of physical communication media.

The aggregation point 120 can also be used to obtain other types of physical layer information. For example, in this embodiment, the aggregation point 120 also obtains information about physical communication media segments that is not otherwise automatically communicated to an aggregation point 120. One example of such information is information about non-connectorized physical communication media segments that do not otherwise have information stored in or on them that are attached to a connector assembly (including, for example, information indicating which ports of the devices are connected to which ports of other devices in the network as well as media information about the segment). Another example of such information is information about physical communication media segments that are connected to devices that are not able to read media information that is stored in or on the media segments that are attached to their ports and/or that are not able to communicate such information to the aggregation point 120 (for example, because such devices do not include such functionality, because such devices are used with media segments that do not have media information stored in or on them, and/or because bandwidth is not available for communicating such information to the aggregation point 120). In this example, the information can include, for example, information about the devices themselves (such as the devices' MAC addresses and IP addresses if assigned to such devices), information indicating which ports of the devices are connected to which ports of other devices in the network (for example, other connector assemblies), and information about the physical media attached to the ports of the devices. This information can be provided to the aggregation point 120, for example, by manually entering such information into a file (such as a spreadsheet) and then uploading the file to the aggregation point 120 (for example, using a web browser) in connection with the initial installation of each of the various items. Such information can also, for example, be directly entered using a user interface provided by the aggregation point 120 (for example, using a web browser).

The aggregation point 120 can also obtain information about the layout of the building or buildings in which the network is deployed, as well as information indicating where each connector assembly 102, physical media segment, and inter-networking device is located within the building. This information can be, for example, manually entered and verified (for example, using a web browser) in connection with the initial installation of each of the various items. In one implementation, such location information includes an X, Y, and Z location for each port or other termination point for each physical communication media segment (for example, X, Y, and Z location information of the type specified in the ANSI/TIA/EIA 606-A Standard (Administration Standard For The Commercial Telecommunications Infrastructure)).

The aggregation point 120 can obtain and maintain testing, media quality, or performance information relating to the various segments of physical communication media that exist in the network. The testing, media quality, or performance information, for example, can be results of testing that is performed when a particular segment of media is manufactured and/or when testing is performed when a particular segment of media is installed or otherwise checked.

The aggregation point 120 also includes functionality that provides an interface for external devices or entities to access the physical layer information maintained by the aggregation point 120. This access can include retrieving information from the aggregation point 120 as well as supplying information to the aggregation point 120. In this embodiment, the aggregation point 120 is implemented as "middleware" that is able to provide such external devices and entities with transparent and convenient access to the PLI maintained by the access point 120. Because the aggregation point 120 aggregates PLI from the relevant devices on the IP network 118 and provides external devices and entities with access to such PLI, the external devices and entities do not need to individually interact with all of the devices in the IP network 118 that provide PLI, nor do such devices need to have the capacity to respond to requests from such external devices and entities.

The aggregation point 120, in the embodiment shown in FIG. 1, implements an application programming interface (API) by which application-layer functionality can gain access to the physical layer information maintained by the aggregation point 120 using a software development kit (SDK) that describes and documents the API. Also, in those embodiments where the connector assemblies 102 include one or more light emitting diodes (LEDs) (for example, where each port 104 has an associated LED), the API and aggregation point 120 can include functionality that enables application-layer functionality to change the state of such LEDs using the API.

For example, as shown in FIG. 1, a network management system (NMS) 130 includes physical layer information (PLI) functionality 132 that is configured to retrieve physical layer information from the aggregation point 120 and provide it to the other parts of the NMS 130 for use thereby. The NMS 130 uses the retrieved physical layer information to perform one or more network management functions (for example, as described below). In one implementation of the embodiment shown in FIG. 1, the PLI functionality 132 of the NMS 130 retrieves physical layer information from the aggregation point 120 using the API implemented by the aggregation point 120. The NMS 130 communicates with the aggregation point 120 over the IP network 118.

As shown in FIG. 1, an application 134 executing on a computer 136 can also use the API implemented by the aggregation point 120 to access the PLI information maintained by the aggregation point 120 (for example, to retrieve such information from the aggregation point 120 and/or to supply such information to the aggregation point 120). The computer 136 is coupled to the IP network 118 and accesses the aggregation point 120 over the IP network 118.

In the embodiment shown in FIG. 1, one or more inter-networking devices 138 used to implement the IP network 118 include physical layer information (PLI) functionality 140. The PLI functionality 140 of the inter-networking device 138 is configured to retrieve physical layer information from the aggregation point 120 and use the retrieved physical layer information to perform one or more inter-networking functions. Examples of inter-networking functions include Layer 1, Layer 2, and Layer 3 (of the OSI model) inter-networking functions such as the routing, switching, repeating, bridging, and grooming of communication traffic that is received at the inter-networking device. In one implementation of such an embodiment, the PLI functionality 140 uses the API implemented by the aggregation point 120 to communicate with the aggregation point 120.

The PLI functionality 140 included in the inter-networking device 138 can also be used to capture physical layer information associated with the inter-network device 138 and the physical communication media attached to it and communicate the captured physical layer information to the aggregation point 120. Such information can be provided to the aggregation point 120 using the API or by using the protocols that are used to communicate with the connector assemblies 102.

The aggregation point 120 can be implemented on a standalone network node (for example, a standalone computer running appropriate software) or can be integrated along with other network functionality (for example, integrated with an element management system or network management system or other network server or network element). Moreover, the functionality of the aggregation point 120 can be distributed across many nodes and devices in the network and/or implemented, for example, in a hierarchical manner (for example, with many levels of aggregation points).

Moreover, the aggregation point 120 and the connector assemblies 102 are configured so that the aggregation point 120 can automatically discover and connect with devices that provide PLI to an aggregation point 120 (such as the connector assemblies 102 and inter-network device 138) that are on the network 118. In this way, when devices that are able to provide PLI to an aggregation point 120 (such as a connector assembly 102 or an inter-networking device 138) are coupled to the IP network 118, an aggregation point 120 is able to automatically discover the connector assembly 102 and start aggregating physical layer information for that connector assembly 102 without requiring the person installing the connector assembly 102 to have knowledge of the aggregation points 120 that are on the IP network 118. Similarly, when an aggregation point 120 is coupled to the IP network 118, the aggregation point 120 is able to automatically discover and interact with devices that are capable of providing PLI to an aggregation point without requiring the person installing the aggregation point 120 to have knowledge of the devices that are on the IP network 118. Thus, the physical-layer information resources described here can be easily integrated into the IP network 118.

The IP network 118 can include one or more local area networks and/or wide area networks (including for example the Internet). As a result, the aggregation point 120, NMS 130, and computer 136 need not be located at the same site as each other or at the same site as the connector assemblies 102 or the inter-networking devices 138.

Various conventional IP networking techniques can be used in deploying the system 100 of FIG. 1. For example, conventional security protocols can be used to secure communications if they are communicated over a public or otherwise unsecure communication channel (such as the Internet or over a wireless communication link).

In one implementation of the embodiment shown in FIG. 1, each connector assembly 102, each port 104 of each connector assembly 102, and each media segment is individually addressable. Where IP addresses are used to individually address each connector assembly 102, a virtual private network (VPN) dedicated for use with the various connector assemblies 102 can be used to segregate the IP addresses used for the connector assemblies 102 from the main IP address space that is used in the IP network 118.

Also, power can be supplied to the connector assemblies 102 using conventional "Power over Ethernet" techniques specified in the IEEE 802.3af standard, which is hereby incorporated herein by reference. In such an implementation, a power hub 142 or other power supplying device (located near or incorporated into an inter-networking device that is coupled to each connector assembly 102) injects DC power onto one or more of the wires (also referred to here as the "power wires") included in the copper twisted-pair cable used to connect each connector assembly 102 to the associated inter-networking device. The interface 116 in the connector assembly 102 picks the injected DC power off of the power wires and uses the picked-off power to power the active components of that connector assembly 102. In the second and third connector assembly configurations 112 and 114, some of the connector assemblies 102 are not directly connected to the IP network 118 and, therefore, are unable to receive power directly from the power wires. These connector assemblies 102 receive power from the connector assemblies 102 that are directly connected to the IP network 118 via the local connections that communicatively couple such connector assemblies 102 to one another. In the fourth configuration 115, the interface 116 picks the injected DC power off of the power wires and supplies power to the master processor 117 and each of the slave processors 106 over the backplane.

In the particular embodiment shown in FIG. 1, the system 100 also supports conventional physical layer management (PLM) operations such as the tracking of moves, adds, and changes of the segments of physical media that are attached to the ports 104 of the connector assemblies 102 and providing assistance with carrying out moves, adds, and changes. PLI provided by the aggregation point 120 can be used to improve upon conventional "guided MAC" processes. For example, information about the location of the port 104 and the visual appearance (for example, the color or shape) of the relevant physical media segment (or connector attached thereto) can be communicated to a technician to assist the technician in carrying out a move, add, or change. This information can be communicated to a computer or smartphone used by the technician. Moreover, the PLI functionality that resides in the system 100 can also be used to verify that a particular MAC was properly carried out by checking that the expected physical media segment is located in the expected port 104. If that is not the case, an alert can be sent to the technician so that the technician can correct the issue.

The PLM functionality included in the system 100 can also support conventional techniques for guiding the technician in carrying out a MAC (for example, by illuminating one or more light emitting diodes (LEDs) to direct a technician to a particular connector assembly 102 and/or to a particular port 104 or by displaying messages on a liquid crystal display (LCD) included on or near the connector assemblies 102).

Other PLM functions include keeping historical logs about the media connected to the connector assembly. In the embodiment shown in FIG. 1, the aggregation point 120 includes PLM functionality 144 that implements such PLM functions. The PLM functionality 144 does this using the physical layer information that is maintained at the aggregation point 120.

The IP network 118 is typically implemented using one or more inter-networking devices. As noted above, an inter-networking device is a type of connector assembly (and a particular implementation of an inter-networking device 138 is referenced separately in FIG. 1 for ease of explanation only). Generally, an inter-networking device can be configured to read media information that is stored in or on the segments of physical media that are attached to its ports and to communicate the media information it reads from the attached segments of media (as well as information about the inter-networking device itself) to an aggregation point 120 like any other connector assembly described here.

In addition to connector assemblies 102, the techniques described here for reading media information stored in or on a segment of physical communication media can be used in one or more end nodes of the IP network 118. For example, computers (such as, laptops, servers, desktop computers, or special-purpose computing devices such as IP telephones, IP multi-media appliances, and storage devices) can be configured to read media information that is stored in or on the segments of physical communication media that are attached to their ports and to communicate the media information they read from the attached segments of media (as well as information about the devices themselves) to an aggregation point 120 as described here.

In one implementation of the system 100 shown in FIG. 1, the ports 104 of each connector assembly 102 are used to implement the IP network 118 over which each connector assembly 102 communicates physical layer information associated with that connector assembly 102. In such an implementation, such physical layer information is communicated over the IP network 118 just like any other data that is communicated over the IP network 118. As noted below, the media interface 108 determines if a physical communication media segment is attached to the corresponding port 104 and, if one is, reads the identifier and attribute information stored in or on the attached segment (if such information is stored therein or thereon) without affecting the normal data signals that pass through that port 104. Indeed, such physical layer information may actually pass through one or more of the ports 104 of connector assemblies 102 in the course of being communicated to and/or from a connector assembly 102, aggregation point 150, network management system 130, and/or computer 136. By using the IP network 118 to communicate physical layer information pertaining to it, a separate network need not be provided and maintained in order to communicate such physical-layer information. However, in other implementations and embodiments, the physical layer information described above is communicated using a network that is separate from the network to which such physical layer information pertains.

FIG. 2 is a block diagram of one high-level embodiment of a port 104 and media interface 108 that are suitable for use in the system 100 of FIG. 1.

Each port 104 comprises a first attachment point 206 and a second attachment point 208. The first attachment point 206 is used to attach a first segment of physical communication media 210 to the port 104, and the second attachment point 208 is used to attach a second segment of physical communication media 212 to the port 104.

In the particular embodiment shown in FIG. 2, the first attachment point 206 is located near the rear of the connector assembly. As a consequence, the first attachment point 206 and the first segment of physical media 210 attached thereto are also referred to here as the "rear attachment point" 206 and the "rear media segment" 210, respectively. Also, in this embodiment, the rear attachment point 206 is configured to attach the rear media segment 210 to the port 104 in a semi-permanent manner. As used herein, a semi-permanent attachment is one that is designed to be changed relatively infrequently, if ever. This is also referred to sometimes as a "one-time" connection. Examples of suitable rear connectors 206 include punch-down blocks (in the case of copper physical media) and fiber adapters, fiber splice points, and fiber termination points (in the case of optical physical media).

In the embodiment shown in FIG. 2, the second attachment point 208 is located near the front of the connector assembly 102. As a consequence, the second attachment point 208 and the second segment of physical media 212 are also referred to here as the "front attachment point" 208 and the "front media segment" 212, respectively. In the embodiment shown in FIG. 2, the front attachment point 208 for each port 104 is designed for use with "connectorized" front media segments 212 that have identifier and attribute information stored in or on them. As used herein, a "connectorized" media segment is a segment of physical communication media that includes a connector 214 at at least one end of the segment. The front attachment point 208 is implemented using a suitable connector or adapter that mates with the corresponding connector 214 on the end of the front media segment 212. The connector 214 is used to facilitate the easy and repeated attachment and unattachment of the front media segment 212 to the port 104. Examples of connectorized media segments include CAT-5, 6, and 7 twisted-pair cables having modular connectors or plugs attached to both ends (in which case, the front connectors are implemented using compatible modular jacks) or optical cables having SC, LC, FC, LX.5, MTP, or MPO connectors (in which case, the front connectors are implemented using compatible SC, LC, FC, LX.5, MTP, or MPO connectors or adapters). The techniques described here can be used with other types of connectors including, for example, BNC connectors, F connectors, DSX jacks and plugs, bantam jacks and plugs, and MPO and MTP multi-fiber connectors and adapters.

Each port 104 communicatively couples the respective rear attachment point 206 to the respective front attachment point 208. As a result, a rear media segment 210 attached to the respective rear attachment point 206 is communicatively coupled to any front media segment 212 attached to the respective front attachment point 208. In one implementation, each port 104 is designed for use with a rear media segment 210 and a front media segment 212 that comprise the same type of physical communication media, in which case each port 104 communicatively couples any rear media segment 210 attached to the respective rear attachment point 206 to any front media segment 212 attached to the respective front attachment point 208 at the physical layer level without any media conversion. In other implementations, each port 104 communicatively couples any rear media segment 210 attached to the respective rear attachment point 206 to any front media segment 212 attached to the respective front attachment point 208 in other ways (for example, using a media converter if the rear media segment 210 and the front media segment 212 comprise different types of physical communication media).

In the exemplary embodiment shown in FIG. 2, the port 104 is configured for use with front media segments 212 that include a storage device 216 in which the media information for that media segment 212 is stored. The storage device 216 includes a storage device interface 218 that, when the corresponding connector 214 is inserted into (or otherwise attached to) a front attachment point 208 of the port 104, communicatively couples the storage device 216 to a corresponding media interface 108 so that the associated programmable processor 106 can read the information stored in the storage device 216. In one implementation of the embodiment shown in FIG. 2, each connector 214 itself houses the storage device 216. In another implementation of such an embodiment, the storage device 216 is housed within a housing that is separate from the connector 214. In such an implementation, the housing is configured so that it can be snapped onto the media segment 212 or the connector 214, with the storage device interface 218 positioned relative to the connector 214 so that the storage device interface 218 will properly mate with the media interface 108 when the connector 214 is inserted into (or otherwise attached to) the front attachment point 208. Although in the exemplary embodiment shown in FIG. 2 only the front media segments 212 include storage devices 216, it is to be understood that in other embodiments connector assemblies and/or other devices are configured to read storage devices that are attached to (or otherwise included with) rear media segments 210 and/or any "auxiliary" media segments (for example, media segments coupled to the network interface 116).

In some implementations, at least some of the information stored in the storage device 216 can be updated in the field (for example, by having an associated programmable processor 106 cause additional information to be written to the storage device 216 or changing or deleting information that was previously stored in the storage device 216). For example, in some implementations, some of the information stored in the storage device 216 cannot be changed in the field (for example, identifier information or manufacturing information) while some of the other information stored in the storage device 216 can be changed in the field (for example, testing, media quality, or performance information). In other implementations, none of the information stored in the storage device 216 can be updated in the field.

Also, the storage device 216 may also include a processor or micro-controller, in addition to storage for the media information. In which case, the micro-controller included in the storage device 216 can be used to execute software or firmware that, for example, controls one or more LEDs attached to the storage device 216. In another example, the micro-controller executes software or firmware that performs an integrity test on the front media segment 212 (for example, by performing a capacitance or impedance test on the sheathing or insulator that surrounds the front physical communication media segment 212 (which may include a metallic foil or metallic filler for such purposes)). In the event that a problem with the integrity of the front media segment 212 is detected, the micro-controller can communicate that fact to the programmable processor 106 associated with the port 104 using the storage device interface 218. The micro-controller can also be used for other functions.

The port 104, connector 214, storage device 216, and media interface 108 are configured so that the information stored in the storage device 216 can be read without affecting the communication signals that pass through the media segments 210 and 212.

Further details regarding system 100 and the port 104 can be found in the following United States patent applications, all of which are hereby incorporated herein by reference: U.S. Provisional Patent Application Ser. No. 61/152,624, filed on Feb. 13, 2009, titled "MANAGED CONNECTIVITY SYSTEMS AND METHODS" (also referred to here as the "'624 Application"); U.S. patent application Ser. No. 12/705,497, filed on Feb. 12, 2010, titled "AGGREGATION OF PHYSICAL LAYER INFORMATION RELATED TO A NETWORK" (is also referred to here as the '497 Application); U.S. patent application Ser. No. 12/705,501, filed on Feb. 12, 2010, titled "INTER-NETWORKING DEVICES FOR USE WITH PHYSICAL LAYER INFORMATION" (also referred to here as the '501 Application); U.S. patent application Ser. No. 12/705,506, filed on Feb. 12, 2010, titled "NETWORK MANAGEMENT SYSTEMS FOR USE WITH PHYSICAL LAYER INFORMATION" (also referred to here as the '506 Application); U.S. patent application Ser. No. 12/705,514, filed on Feb. 12, 2010, titled "MANAGED CONNECTIVITY DEVICES, SYSTEMS, AND METHODS" (also referred to here as the '514 Application); U.S. Provisional Patent Application Ser. No. 61/252,395, filed on Oct. 16, 2009, titled "MANAGED CONNECTIVITY IN ELECTRICAL SYSTEMS AND METHODS THEREOF" (also referred to here as the "'395 Application"); U.S. Provisional Patent Application Ser. No. 61/253,208, filed on Oct. 20, 2009, titled "ELECTRICAL PLUG FOR MANAGED CONNECTIVITY SYSTEMS" (also referred to here as the "'208 Application"); U.S. Provisional Patent Application Ser. No. 61/252,964, filed on Oct. 19, 2009, titled "ELECTRICAL PLUG FOR MANAGED CONNECTIVITY SYSTEMS" (also referred to here as the "'964 Application"); U.S. Provisional Patent Application Ser. No. 61/252,386, filed on Oct. 16, 2009, titled "MANAGED CONNECTIVITY IN FIBER OPTIC SYSTEMS AND METHODS THEREOF" (also referred to here as the "'386 Application"); U.S. Provisional Patent Application Ser. No. 61/303,961, filed on Feb. 12, 2010, titled "FIBER PLUGS AND ADAPTERS FOR MANAGED CONNECTIVITY" (the "'961 Application"); and U.S. Provisional Patent Application Ser. No. 61/303,948, filed on Feb. 12, 2010, titled "BLADED COMMUNICATIONS SYSTEM" (the "'948 Application").

FIG. 3A is a diagram illustrating one exemplary embodiment of a front media segment. In the embodiment shown in FIG. 3A, the front media segment comprises a "patch cord" 312 that is used to selectively cross-connect two ports of the same or different patch panels. The patch cord 312 shown in FIG. 3A is suitable for use with an implementation of a patch panel where the front connectors of the ports are implemented using modular RJ-45 jacks. The patch cord 312 shown in FIG. 3A comprises a copper unshielded twisted-pair (UTP) cable 386. The UTP cable 386 includes eight conductors arranged in four conductor pairs. The patch cord 312 also comprises two RJ-45 plugs 314, one at each end of the cable 386 (only one of which is shown in FIG. 3A). The RJ-45 plugs 314 are designed to be inserted into the RJ-45 modular jacks used as the front connectors. Each RJ-45 plug 314 comprises a contact portion 388 in which eight, generally parallel electrical contacts 390 are positioned. Each of the eight electrical contacts 390 are electrically connected to one of the eight conductors in the UTP cable 386.

Each plug 314 also comprises (or is attached to) a storage device 392 (for example, an Electrically Erasable Programmable Read-Only Memory (EEPROM) or other non-volatile memory device). The media information described above for the patch cord 312 is stored in the storage device 392. The storage device 392 includes sufficient storage capacity to store such information. Each storage device 392 also includes a storage device interface 394 that, when the corresponding plug 314 is inserted into a front connector of a port 304, communicatively couples the storage device 392 to the corresponding media interface so that the programmable processor 320 in the corresponding patch panel 302 can read the information stored in the storage device 392.

Examples of such a patch cord 312 and plug 314 are described in the '395 Application, the '208 Application, and the '964 Application.

FIG. 3B is a diagram illustrating another exemplary embodiment of a patch cord 312'. The patch cord 312' shown in FIG. 3B is suitable for use with a fiber patch panel where the front connectors of the ports are implemented using fiber LC adapters or connectors. The patch cord 312' shown in FIG. 3B comprises an optical cable 386'. The optical cable 386' includes an optical fiber enclosed within a suitable sheathing. The patch cord 312' also comprises two LC connectors 314', one at each of the cable 386'. Each LC connector 314' is designed to be inserted into an LC adapter used as the front connector of a port of a fiber patch panel. Each LC connector 314' comprises an end portion 388' at which an optical connection with the optical fiber in the cable 386' can be established when the LC connector 314' is inserted in an LC adapter of a port.

Each LC connector 314' also comprises (or is attached to) a storage device 392' (for example, an Electrically Erasable Programmable Read-Only Memory (EEPROM) or other non-volatile memory device). The media information described above for the patch cord 312 is stored in the storage device 392'. The storage device 392' includes sufficient storage capacity to store such information. Each storage device 392' also includes a storage device interface 394' that, when the corresponding LC connector 314' is inserted into a front connector of a port, communicatively couples the storage device 392' to the corresponding media interface so that the programmable processor in the corresponding fiber patch panel can read the information stored in the storage device 392'.

In some implementations of the patch cords 312 and 312', the storage devices 392 and 392' are implemented using a surface-mount EEPROM or other non-volatile memory device. In such implementations, the storage device interfaces and media interfaces each comprise four leads—a power lead, a ground lead, a data lead, and an extra lead that is reserved for future use. In one such implementation, an EEPROM that supports a serial protocol is used, where the serial protocol is used for communicating over the signal data lead. The four leads of the storage device interfaces come into electrical contact with four corresponding leads of the media interface when the corresponding plug or connector is inserted in the corresponding front connector of a port 304. Each storage device interface and media interface are arranged and configured so that they do not interfere with data communicated over the patch cord. In other embodiments, other types of interfaces are used. For example, in one such alternative embodiment, a two-line interface is used with a simple charge pump. In other embodiments, additional lines are provided (for example, for potential future applications).

Examples of such fiber patch cords 312' and connectors 314' are described in U.S. Provisional Patent Application Ser. No. 61/252,386, filed on Oct. 16, 2009, titled "MANAGED CONNECTIVITY IN FIBER OPTIC SYSTEMS AND METHODS THEREOF" (also referred to here as the "'386 Application"), U.S. Provisional Patent Application Ser. No. 61/303,961, filed on Feb. 12, 2010, titled "FIBER PLUGS AND ADAPTERS FOR MANAGED CONNECTIVITY" (the "'961 Application"), and U.S. Provisional Patent Application Ser. No. 61/303,948, filed on Feb. 12, 2010, titled "BLADED COMMUNICATIONS SYSTEM" (the "'948 Application"). The '386 Application, the '961 Application, and the '948 Application are hereby incorporated herein by reference.

In some implementations of the patch cords 312 and 312', each plug 314 or connector 314' itself houses the respective storage device and storage device interface. In implementations, each storage device and corresponding storage device interface are housed within a housing that is separate from the corresponding plug or connector. In such implementations, the housing is configured so that it can be snapped onto (or otherwise attached to) the cable or the plug or connector, with the storage device interface positioned relative to the plug or connector so that the storage device interface will properly mate with the relevant media interface when the plug or connector is inserted into the front connector of the corresponding port.

Moreover, functionality described here as being implemented in software executing on a programmable processor can be implemented in other ways. For example, such functionality can be implemented in hardware using discrete hardware, application-specific integrated circuits (ASICS)), programmable devices (such as field-programmable gate arrays (FPGAs) or complex programmable logic devices (CPLDs)), and/or combinations of one or more of the foregoing, and/or combinations of one or more of the foregoing along with software executing on one or more programmable processors. For example, the detection of the insertion of a connector 214 into a port 104 of a connector assembly 102 and/or the reading of information from any storage device 216 attached to the connector 214 can be implemented in hardware (for example, using one or more programmable devices and/or an ASIC) in addition to or instead of being implemented as software.

When a segment of physical communication media having a single communication path, such as a copper wire, is connected to a module or patch panel, a communication path linking the segment of physical communication media and the module is known because there is a one-to-one relationship between the segment and the module. However, some cables or physical communication media comprise multiple communication paths (for example, multiple wires or fibers) that are bundled together (referred to herein as a "multipath cable"). Typically, a first end of a connectorized multipath cable has a single connector that connects all the fibers at once. In some multipath cables, a second end of the cable has a plurality of connectors, where each fiber or group of fibers has its own connector. However, once one of the plurality of connectors is connected and creates a logical communication link with the module, there is no indication of which fiber is used in that logical communication link (also referred to herein as "pathway"). In other words, when such a multipath cable is coupled to a module, it is often unknown where exactly each fiber is connected.

In the embodiments of connector assemblies 102 described above, each front attachment point 208 is associated with only a single rear attachment point 206, and each rear attachment point 206 is only associated with a single front attachment point 208. In other words, there is a one-to-one relationship between each front attachment point 208 and each rear attachment point 206 and between each rear attachment point 206 and each front attachment point 208. For example, in connector assemblies 102 that are used with twisted-pair cables, each front attachment point 208 (implemented using a RJ-45 jack, for example) is associated with a single a rear attachment point 206 (implemented using a punch-down block, for example), and each rear attachment point 206 is associated with a single front attachment point 208.

These one-to-one relationships exist even though each front attachment point 208 is coupled to the rear attachment point 206 using the eight lines (four pairs) that are within a twisted-pair cable. In another example, where a connector assembly 102 is used with simplex optical fiber cables, each front attachment point 208 (implemented using an LC connector, for example) is associated with a single rear attachment point 206 (also implemented using an LC connector, for example), and each rear attachment point 206 is associated with a single front attachment point 208. In yet another example, a connector assembly 102 is used with duplex fiber optic cables, where each fiber cable comprises two separate optical fibers (where one of the fibers is commonly referred to as the "TX" fiber and the other is commonly referred to as the "RX" optical fiber). In such an example, each duplex fiber is terminated with two LC connectors—one connector for the TX fiber and the other connector for the RX fiber. These connectors are commonly packaged together in a duplex connector package (also referred to as a "duplex connector").

That is, attachment points of the connector assembly 102 are used to connect a single duplex fiber optic cable to the connector assembly 102. In this example, it is still the case that each front attachment point 208 (implemented using an LC connector, for example) is associated with a single rear attachment point 206 (also implemented using an LC connector, for example), and each rear attachment point 206 is associated with a single front attachment point 208.

Figure 4:
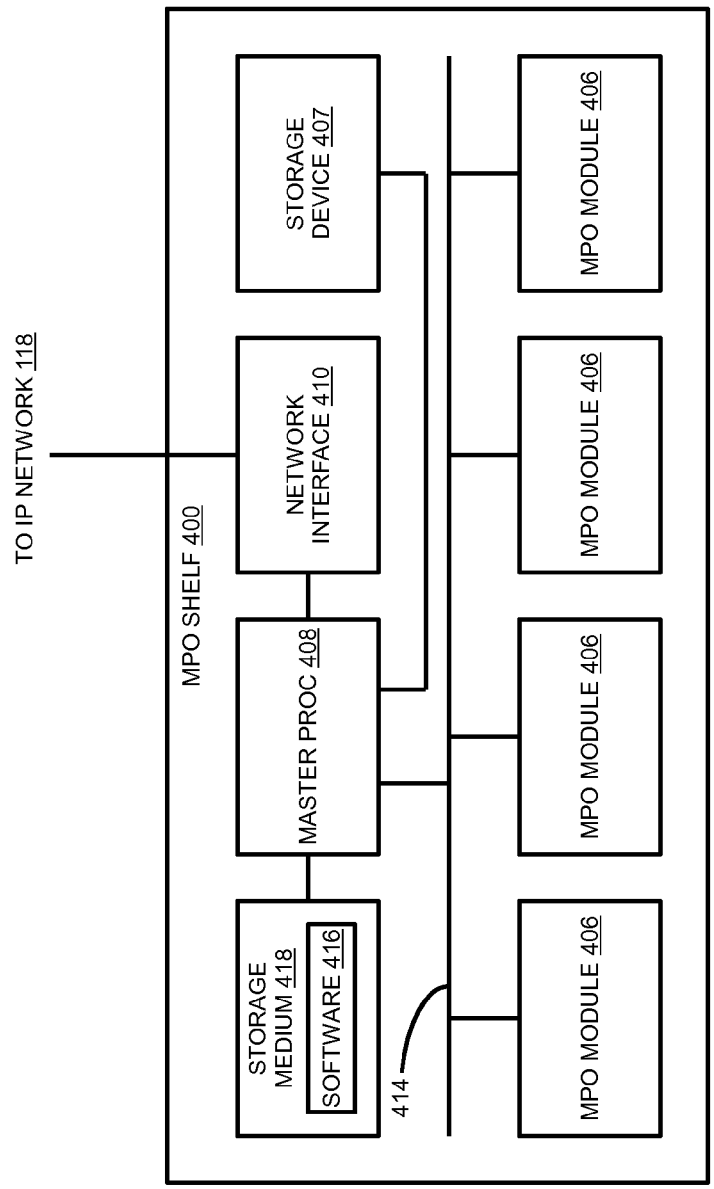
FIG. 4 is a block diagram of an exemplary embodiment of a connector assembly configured for use with multi-fiber push-on (MPO) connectors.
Figure 5:
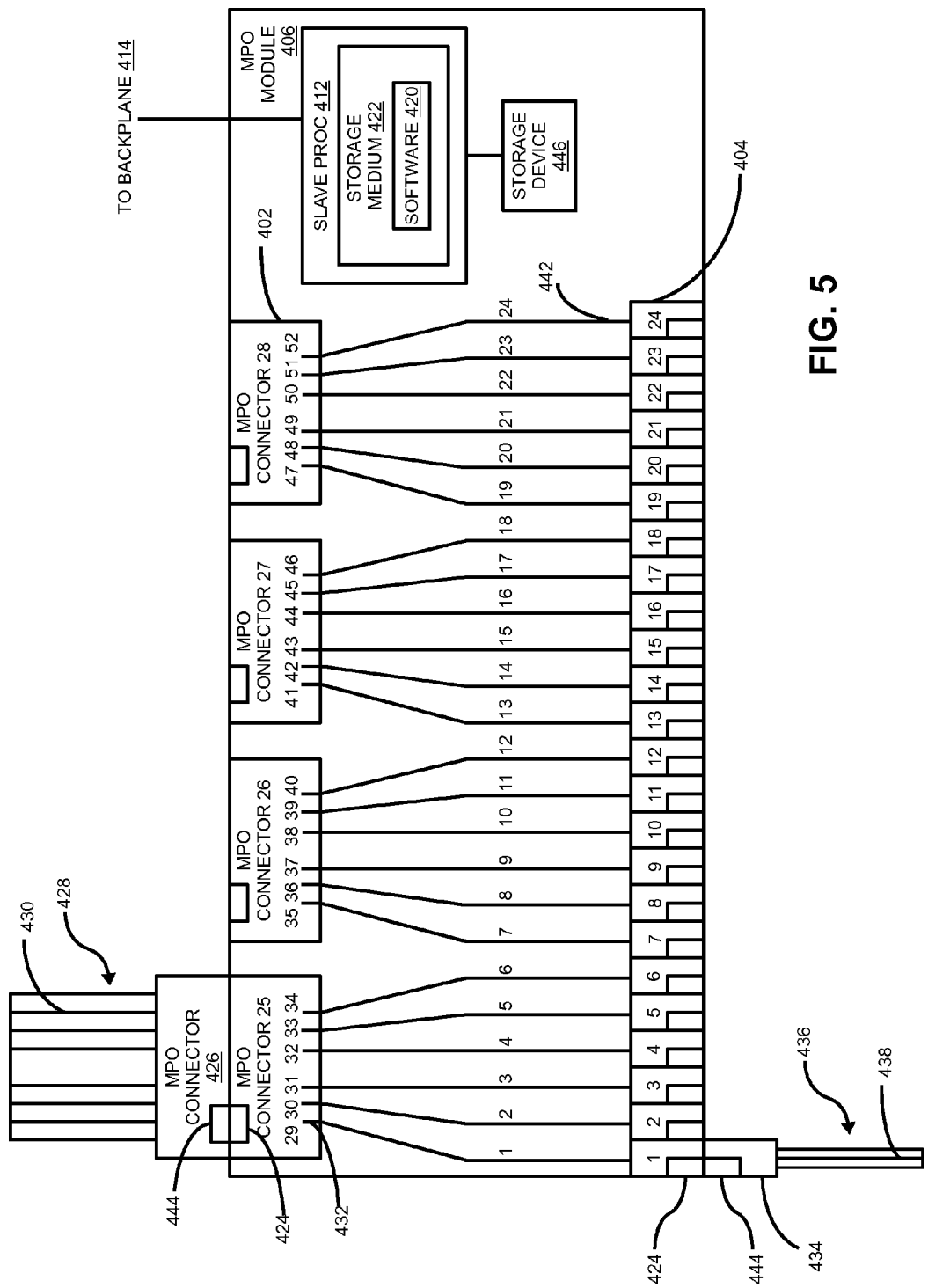
FIG. 5 is a block diagram of an exemplary embodiment of an MPO module used in the connector assembly of FIG. 4.

However, in some embodiments, at least some of the attachment points of a connector assembly 102 will be associated with more than one other attachment point of the connector assembly 102. One such exemplary embodiment is shown in FIGS. 4 and 5. FIGS. 4 and 5 are block diagrams of one exemplary embodiment of a connector assembly 400 that is configured to be used with multi-fiber push-on (MPO) connectors. In this exemplary embodiment, each of the rear attachment points 402 (shown in FIG. 5) is implemented using a respective MPO connector that is associated with a respective six front attachment points 404 (shown in FIG. 5). That is, in the embodiment shown in FIGS. 4 and 5, there is not a one-to-one relationship between each rear attachment point 402 and a single front attachment point 404 and, instead, there is a one-to-six relationship between each rear attachment point 402 and six front attachment points 404.

In the exemplary embodiment shown in FIGS. 4 and 5, the connector assembly 400 (shown in FIG. 4) makes use of a master-slave configuration of the type described above in connection with configuration 115 of FIG. 1. In this exemplary embodiment, the connector assembly 400 includes four MPO modules 406. In one implementation of such an embodiment, the connector assembly 400 is implemented as a shelf that includes the four MPO modules 406. The connector assembly 400 includes a master programmable processor 408 (also referred to here as "master processor" 408) and a network interface 410. The network interface 410 is configured to communicatively couple the master processor 408 to an IP network 118 so that the master processor 408 and one or more aggregation points 120 (not shown in FIGS. 4 and 5) can communicate with each other. Each of the four MPO modules 406 includes a respective slave programmable processor 412 (also referred to here as a "slave processor" 412) (shown in FIG. 5). The master processor 408 communicates with each of the slave processors 412 over a backplane 414 (shown in FIG. 4). In one implementation of such an embodiment, the four MPO modules 406 are housed within a common chassis, where the backplane 414 is implemented within the common chassis. Also, in one implementation of such an embodiment, the master processor 408 and the slave processors 412 communicate with one another using a master-slave protocol.

The master processor 408 is configured to execute software or firmware 416 (also referred to here as "master software" 416) that causes the master processor 408 to carry out various functions described below. The master software 416 comprises program instructions that are stored (or otherwise embodied) on an appropriate non-transitory storage medium or media 418 (such as flash or other non-volatile memory, magnetic disc drives, and/or optical disc drives). At least a portion of the program instructions are read from the storage medium 418 by the master processor 404 for execution thereby. The storage medium 418 on or in which the program instructions are embodied is also referred to here as a "program product". Although the storage medium 418 is shown in FIG. 4 as being included in, and local to, the connector assembly 400, it is to be understood that remote storage media (for example, storage media that are accessible over a network or communication link) and/or removable media can also be used. Each connector assembly 400 also includes suitable memory (not shown) that is coupled to the master processor 408 for storing program instructions and data.

The connector assembly 400 also includes a storage device 407 in which information about the connector assembly 400 is stored. The storage device 407 can be combined with the storage medium 418 used to store the master software 416.

The master processor 408 (and the master software 416 executing thereon) is configured to carry out the master processor functionality described above in connection with the master-slave configuration 115 shown in FIG. 1. For example, the master processor 408 (and the master software 416 executing thereon) is configured to interact with the IP network 118 and one or more aggregation points 120. The master processor 408 also interacts with, and controls, the slave processors 412.

Each slave processor 412 (shown in FIG. 5) is configured to execute software or firmware 420 (also referred to here as "slave software" 420) that causes the slave processor 412 to carry out various functions described below. The slave software 420 comprises program instructions that are stored (or otherwise embodied) on an appropriate non-transitory storage medium or media 422 (such as flash or other non-volatile memory, magnetic disc drives, and/or optical disc drives). At least a portion of the program instructions are read from the storage medium 422 by the slave processor 412 for execution thereby. The storage medium 422 on or in which the program instructions are embodied is also referred to here as a "program product". Although the storage medium 422 is shown in FIG. 5 as being included in, and local to, a respective one of the MPO modules 406, it is to be understood that the storage medium 422 can be combined with storage medium 418 used by the master processor 408 and/or remote storage media (for example, storage media that are accessible over a network or communication link) and/or removable media can be used. Each MPO module 406 also includes suitable memory (not shown) that is coupled to the slave processor 412 for storing program instructions and data.

Each slave processor 412 (and the slave software 420 executing thereon) is configured to carry out the slave processor functionality described above in connection with the master-slave configuration 115 shown in FIG. 1. For example, the slave processor 412 (and the slave software 420 executing thereon) is configured to determine if an optical cable is attached to each of the rear and front attachment points 402 and 404 (shown in FIG. 5) included in the associated MPO module 406 and, if one is, to read any information stored in or on the attached optical cable (if the optical cable includes information stored therein or thereon) using a respective media interface 424 (shown in FIG. 5).

As noted above, the connector assembly 400 and the MPO modules 406 shown in FIGS. 4 and 5 are configured to be used with MPO connectors. In particular, the exemplary embodiment shown in FIGS. 4 and 5 is described here as being implemented for use with MPO connectors that are used to terminate six separate optical fibers. In this embodiment, the rear attachment points 402 are implemented using MPO connectors. The rear attachment points 402 are also referred to here, in the context of FIGS. 4 and 5, as "MPO connectors 402". Each MPO connector 402 of each MPO module 406 is configured to connect to a respective MPO connector 426 attached to one end of a trunk cable 428. The trunk cable 428 includes six optical fibers 430. The MPO connector 426 attached to the trunk cable 428 is used to terminate all six of those optical fibers 430 in the trunk cable 428 at the MPO module 406. Each MPO connector 402 included in the MPO module 406 includes six internal attachment points 432, each of which is used to terminate a respective one of the optical fibers 430 in the trunk cable 428. Each such internal attachment point 432 is "internal" in the sense that each internal attachment point 432 is within (that is, is internal to) one of the MPO connectors 402.

In the exemplary embodiment shown in FIGS. 4 and 5, each front attachment point 404 is implemented using an LC connector. The front attachment points 404 are also referred to here, in the context of FIG. 4, as "LC connectors 404". Each LC connector 404 of each MPO module 406 is configured to connect to a respective LC connector 434 attached to one end of a fiber optic cable 436. Each fiber optic cable 436 includes a single optical fiber 438.

Each MPO module 406 includes internal optical connections 442. Each internal optical connection 442 is used to optically couple one of the LC connectors 404 to one of the internal attachment points 432 within one of the MPO connectors 402. In this way, each optical fiber 430 in the trunk cable 428 that is attached to an MPO connector 402 of an MPO module 406 can be optically coupled to a corresponding optical fiber 438 in an fiber optic cable 436 that is attached to a corresponding LC connector 404 of that MPO module 406.

In the exemplary embodiment shown in FIG. 5, each MPO module 406 includes four MPO connectors 402, twenty four LC connectors 404, and twenty four internal attachment points 432. Also, in FIG. 5, each of the attachment points is separately referenced using a number from 1 to 52, wherein the LC connectors 404 (that is, the front attachment points 404) are numbered 1 through 24, the MPO connectors 402 (that is, the rear attachment points 402) are numbered 25 through 28, and the internal attachment points 432 are numbered 29 through 52. Also, in the example shown in FIG. 5, there are twenty four internal optical connections 442, which are individually numbered in FIG. 5 as 1 through 24.

Each MPO connector 402 and LC connector 404 of each MPO module 406 has a respective media interface 424 via which the slave processor 420 is able to determine if an optical cable is attached to that connector and, if one is, to read information from any storage device 444 attached to the optical cable. The slave processor 412 in each MPO module 406 is communicatively coupled to each of the media interfaces 424 using a suitable bus or other interconnect (not shown).

In the exemplary embodiment shown in FIG. 5, each MPO module 406 also includes a storage device 446 in which information about the MPO module 406 is stored. The storage device 446 can be combined with the storage medium 422 used to store the slave software 420. As noted above, each slave processor 412 communicates the information read from the storage devices 444 and 446 to the master processor 408 over the backplane 414.

The information stored in the storage device 446 includes information that identifies the MPO module 406 as well as information that identifies the associations between the MPO connectors 402, the LC connectors 404, the internal attachment points 432, and the internal optical connections 442.

For example, in the exemplary embodiment shown in FIG. 5, MPO connector 25 is associated with internal attachment points 29 through 34, MPO connector 26 is associated with internal attachment points 35 through 40, MPO connector 27 is associated with internal attachment points 41 through 46, and MPO connector 28 is associated with internal attachment points 46 through 52. Also, in this example, each of the internal attachments points 29 through 52 is associated with a respective one of the LC connectors 1 through 24.

In this example, the internal optical connections 1 through 6 are associated with LC connectors 1 through 6, respectively, as well as internal attachment points 29 through 34, respectively, and MPO connector 25. The internal optical connections 7 through 12 are associated with LC connectors 7 through 12, respectively, as well as internal attachment points 35 through 40, respectively, and MPO connector 26. The internal optical connections 13 through 18 are associated with LC connectors 13 through 18, respectively, as well as internal attachment points 41 through 46, respectively, and MPO connector 27. The internal optical connections 19 through 24 are associated with LC connectors 19 through 24, respectively, as well as internal attachment points 47 through 52, respectively, and MPO connector 28.

Multiple separate communication paths can be formed from each MPO connector 402 through the MPO module 406. For example, when an MPO connector 426 attached to trunk cable 428 is inserted into MPO connector 25 of the MPO module 406, one communication path is formed by coupling one of the optical fibers 430 in the trunk cable 428 to internal attachment point 29. Internal attachment point 29 is coupled to internal optical connection 1, which is coupled to LC connector 1. An LC connector 434 attached to a fiber optic cable 436 can be connected to LC connector 1 in order to couple the single optical fiber 438 within that fiber optic cable 436 to the internal connection 1. In this way, a communication path is formed through the MPO module 406 between the optical fiber 430 in the trunk cable 428 and the optical fiber 438 in the fiber optic cable 436. In the example shown in FIG. 5, twenty four such communication paths can be formed, where six separate communication paths can be formed for each MPO connector 402 of the MPO module 406.

Figure 6A:
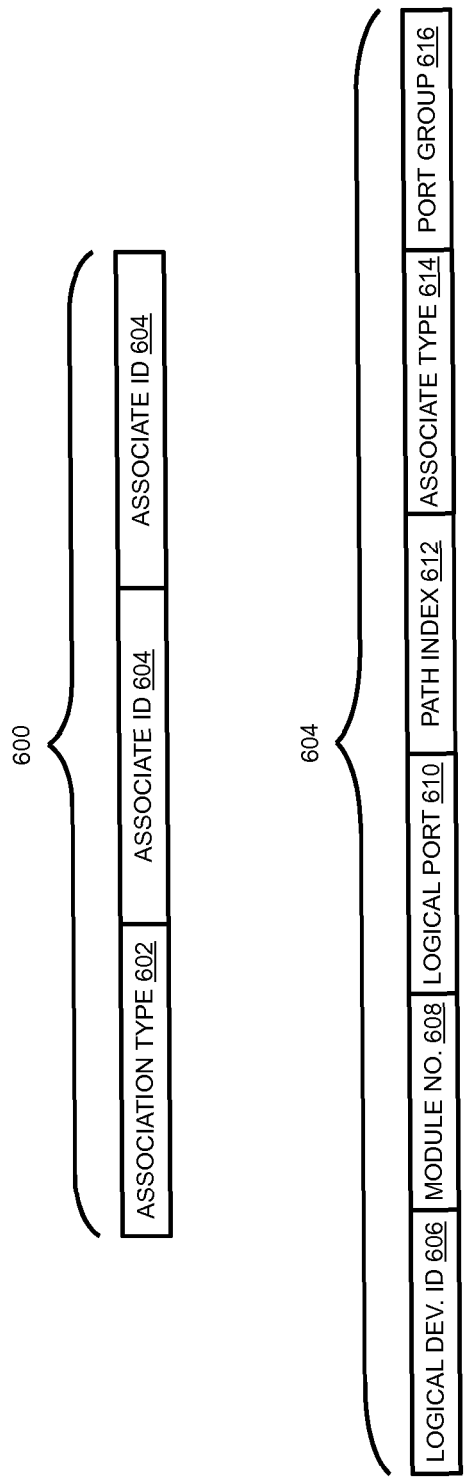
FIGS. 6A-6B illustrate one example of a scheme for tracking the communication paths that exist within each MPO module of FIGS. 4 and 5.
Figure 6B:
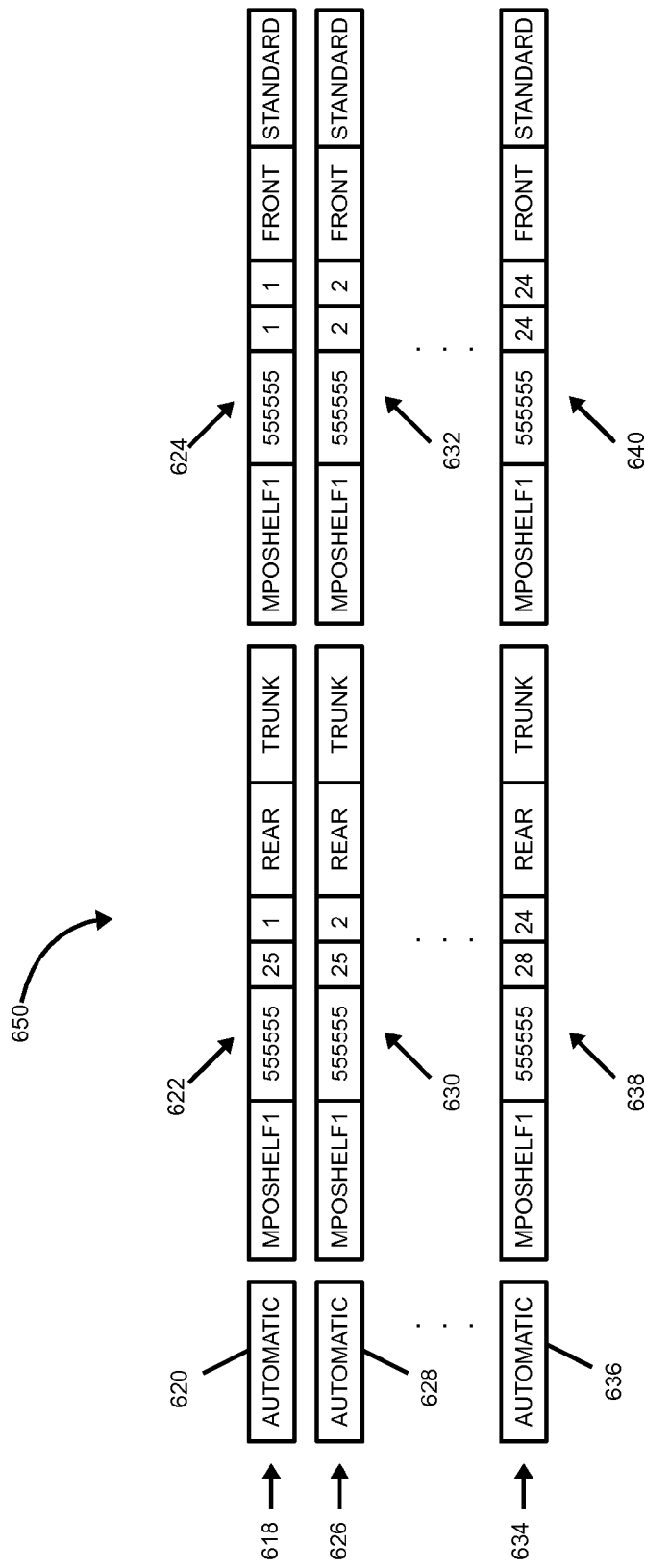

FIGS. 6A-6B illustrates one example of a scheme for tracking the communication paths that exist within each MPO module 406 of FIGS. 4 and 5. In this example, each communication path within each MPO module 406 is described using an "association" 600. Each association 600 is formed between two "associates". Each associate identifies either an MPO connector 402 or an LC connector 404.

As shown in FIG. 6A, each association 600 comprises an association type 602 and two associate identifiers 604. In this example, there are two association types 602. One of the association types 602 is an "automatic" type that refers to an association that can be automatically discovered by the aggregation point 120 or other entity in the system. In this example, the second association type 602 is a "manual" type that refers to an association that has been manually supplied to the aggregation point 120 or other entity in the system.

Each associate identifier 604 is constructed as follows. The particular connector that is being identified by each associate identifier 604 is also referred to here as the "identified connector". The first part of the associate identifier 604 is a logical device identifier 606 that identifies a logical device of which the corresponding communication path is a part. A logical device refers to a connector assembly or other device that includes one or more attachment points or an assembly or other grouping thereof. A logical device can refer to a physical connector assembly or other device, a physical assembly or other grouping of connector assemblies or other devices, or a logical grouping of connector assemblies or other devices or assemblies or other groupings thereof. In this way, the aggregation point 120 (and the other entities that make use of the data aggregated by the aggregation point 120) can track connector assemblies and other devices in ways that are meaningful or convenient to users of the system. In this example, each logical device is assigned a logical device identifier that uniquely identifies that particular logical device within the particular system of interest.

The next parts of each associate identifier 604 are a module number 608 that identifies the particular MPO module 406 of which the identified connector is a part and a logical port number 610 that identifies a particular one of the connectors located within the identified module 406. In this exemplary embodiment, each MPO connector 406 is referred to as a single logical port, even though it is associated with multiple LC connectors 404. Also, in this exemplary embodiment, each MPO module 406 is assigned a module number 608 that is locally unique within the context of the respective logical device (the MPO shelf 400 of FIG. 4 in this example). Furthermore, each MPO connector 402 and LC connector 404 is assigned a logical port number 610 that is locally unique within the context of the respective MPO module 406.

The next part of each associate identifier 604 is a path index 612. The path index 612 identifies which internal attachment point 432 and internal optical connection 442 are used to form the identified communication path. In this exemplary embodiment, each path index 612 is locally unique within the context of the respective MPO module 406.

The next part of each associate identifier 604 is an associate type 614 that identifies whether the identified connector is a rear attachment point 402 (an MPO connector 402 in this example) or a front attachment point 404 (an LC connector 404 in this example).

The final part of each associate identifier 604 is a port group 616 that identifies the type of port identified by that associate identifier 604. In this exemplary embodiment, each logical port can be included in one of the following three groups: a "standard" port that refers to a logical port that is used to make a connection with a single logical communication channel, a "trunk" port that refers to a logical port that is used to a make a connection with multiple logical communications channels, and an "auxiliary" port that refers to a management port that is used to couple that device to the aggregation point 120 if a separate port is provided for that purpose. In this exemplary embodiment, the LC connectors 404 are included in the standard port group, the MPO connectors 402 are included in the trunk port group, and the network interface 410 of MPO shelf 400 (shown in FIG. 4) is included in the auxiliary port group.

FIG. 6B shows a set 650 of associations that describe the communications paths through the MPO module 406 of FIG. 5.

In this example, one association 618 is used to describe the communication path that is formed between MPO connector 25 and LC connector 1 of FIG. 5. In this example, all of the associations are of the automatic type (that is, they can be automatically discovered by the aggregation point 120 or other entity in the system). As a result, the association 618 has an association type 620 of "AUTOMATIC". Association 618 associates an associate identifier 622 for MPO connector 25 of FIG. 5 with an associate identifier 624 for LC connector 1 of FIG. 5 in order to identify the communication path formed therebetween. In this example, the connector assembly 400 shown in FIG. 4 is its own logical device and has the logical device identifier of "MPOSHELF1". Also, in this example, the MPO module 406 for this set 650 of associations has a module identifier of "55555". Therefore, the associate identifier 622 for MPO connector 25 has a logical device identifier of "MPOSHELF1" and a module identifier that has a value of "55555".

In this example, the logical ports of the MPO module 406 are numbered from 1 to 28 as shown in FIG. 5. Thus, the associate identifier 622 for MPO connector 25 has a logical port number of "25". The associate identifier 622 for MPO connector 25 also has a path index of "1", which corresponds to the internal attachment point 29 of the MPO connector 25 and the corresponding internal optical connection 1 of FIG. 5 that are used to form the communication path between MPO connector 25 and LC connector 1. The associate identifier 622 for MPO connector 25 also has an associate type of "REAR" since MPO connector 25 is a rear attachment point in the example shown in FIG. 5. The associate identifier 622 for MPO connector 25 has a port group of "TRUNK" since it refers to a logical port that is used to a make a connection with multiple logical communications channels.

In this example, the associate identifier 624 for LC connector 1 has a logical device identifier of "MPOSHELF1" and a module identifier that has a value of "55555".

The associate identifier 624 for LC connector 1 has a logical port number of "1". The associate identifier 624 for LC connector 1 also has a path index of "1", which corresponds to internal optical connection 1 of FIG. 5 that is coupled between the MPO connector 25 and the LC connector 1. The associate identifier 624 for LC connector 1 also has an associate type of "FRONT" since LC connector 1 is a front attachment point in the example shown in FIG. 4. The associate identifier 624 for LC connector 1 has a port group of "STANDARD" since it refers to a logical port that is used to make a connection with a single logical communication channel.

Therefore, association 618, which includes associate identifiers 622 and 624, identifies the communication path shown in FIG. 5 that is formed between the internal attachment point 29 of MPO connector 25 and LC connector 1 of the MPO module 406.

As shown in FIGS. 6A-6B, the set 650 of associations includes an appropriate association for each of the twenty four communication paths in the MPO module 406 shown in FIG. 5. For example, as shown in FIGS. 6A-6B, association 626 describes a communication path through the MPO module 406 of FIG. 5 from the MPO connector 25 to LC connector 2. For the reason noted above, the association 626 has an association type 628 of "AUTOMATIC". In association 626, the MPO connector 25 is identified by associate identifier 630 and the LC connector 2 is identified by associate identifier 632.

Similarly, association 634 describes a communication path through the MPO module 406 of FIG. 5 from the MPO connector 28 to LC connector 24. For the reason noted above, the association 634 has an association type 636 of "AUTOMATIC". In association 634, the MPO connector 28 is identified by associate identifier 638 and the LC connector 24 is identified by associate identifier 640.

Information indicative of the set 650 of associations for (and, therefore, the communication paths through) the MPO module 406 are stored in the storage device 446 in the MPO module 406 and/or the storage device 407 in the MPO shelf 400.

In one example implementation, the set 650 of associations for the communication paths through the MPO module 406 can be directly stored in the storage device 446 of the MPO module 406. In another example implementation, the set 650 of associations is stored in a "compressed" form. That is, in such an implementation, the aggregation point 120 infers the set 650 of associations from information that is read from the storage device 446 in the MPO module 406 and/or the storage device 407 in the MPO shelf 400. In such an implementation, the logical device identifier can be read from the storage device 407 in the MPO shelf 400 and the module number 608 can be read from the storage device 446 in the MPO module 406. Also, in such an implementation, the configuration of the MPO connectors and LC connectors can be inferred from other data that is read from the storage device 446 of the MPO module 406 (for example, data that specifies the number and type of MPO modules, the number and type of LC modules, the number of LC modules that are associated with each MPO module (if it is not otherwise inferable from the type of MPO connector), and a numbering scheme for the logical ports and path indexes).

As described in more detail below in connection with FIG. 8, the slave processor 412 associated with the MPO module 406 reads this information and communicates it to the aggregation point 120.

Figure 7:
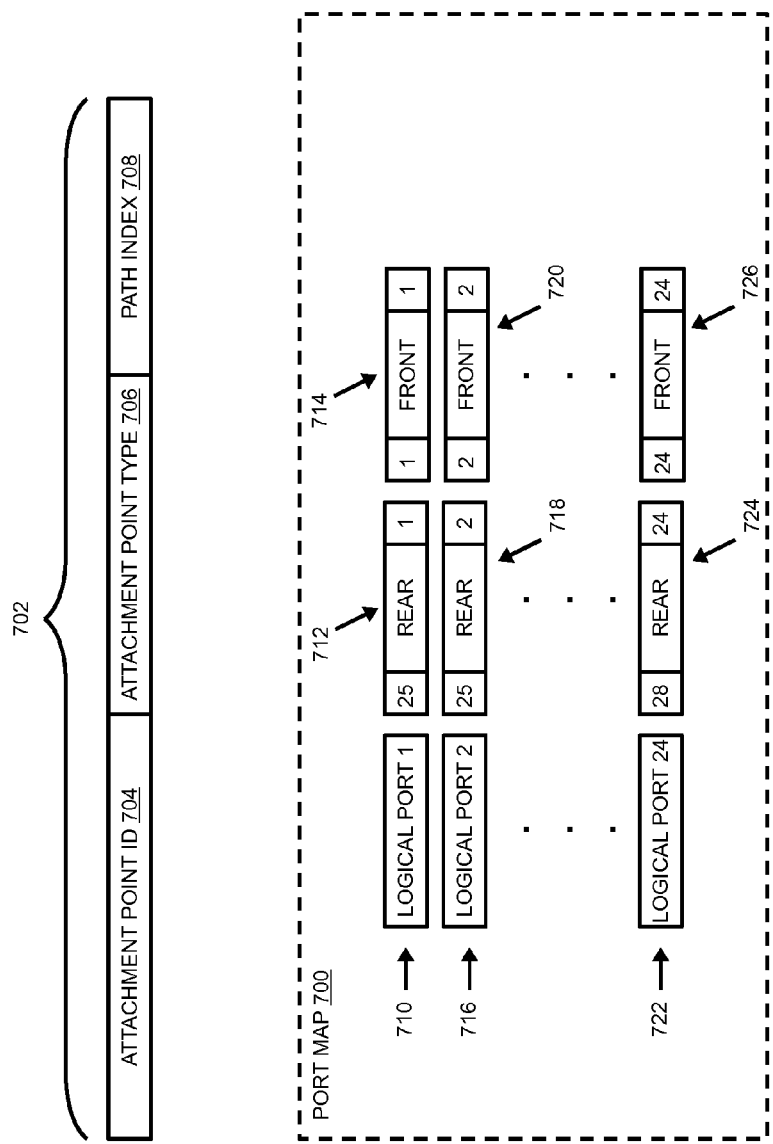
FIG. 7 illustrates another example of a scheme for tracking the communication paths that exist within each MPO module of FIGS. 4 and 5.

FIG. 7 illustrates another example of a scheme for tracking the communication paths that exist within the MPO module 406 of FIGS. 4 and 5. In the scheme described here in connection with FIG. 7, a port map 700 is defined for the MPO module 406 that specifies a set of "logical ports". However, unlike in the scheme described above in connection with FIGS. 6A-6B where each logical port is associated a single attachment point, in the scheme described here in connection with FIG. 7, each logical port is associated with a respective one of the communication paths through the MPO module 406 and a pair of attachment points—one front attachment point (one LC connector 404 in this example) and one rear attachment point (one MPO connector 402 in this example).

In this example, each logical port is identified by an association. As with the example described above in connection with FIGS. 6A-6B, each association is formed between two associates, where each associate identifies a particular attachment point—either an MPO connector 402 or an LC connector 404. Each logical port is also given a "logical port identifier" that is the same as the identifier that is assigned to the front attachment point 404 associated with that logical port.

Each associate is identified using an associate identifier 702 that is constructed as follows. The first part of the associate identifier 702 is an attachment point identifier 704 that identifies the particular attachment point within the MPO module 406 that is being identified by that associate identifier 702. In this particular example, the attachment point identifier 704 is used to identify either an MPO connector 402 or an LC connector 404. Furthermore, in this example, each MPO connector 402 and LC connector 404 is assigned an attachment point identifier 704 that is locally unique within the context of the respective MPO module 406 (for example, by consecutively numbering the connectors as shown in FIG. 5).

The next part of each associate identifier 702 is an attachment point type 706 that identifies whether the identified attachment point is a rear attachment point 402 (an MPO connector 402 in this example) or a front attachment point 404 (an LC connector 404 in this example). The final part of each associate identifier 702 is a path index 708. The path index 708 identifies which internal optical connection 442 is coupled to the identified attachment point.

The port map 700 includes an association for each of the twenty four logical ports (and associated communication paths) of the MPO module 406 shown in FIG. 5. In the example shown in FIG. 7, the port map 700 includes an association 710 for "logical port 1". Logical port 1 is associated with LC connector 1 and MPO connector 25. Thus, association 710 associates MPO connector 25 (identified by an associate identifier 712) with LC connector 1 (identified by associate identifier 714). In this example, the associate identifier 712 for MPO connector 25 has an attachment point identifier that has a value of "25", which corresponds to MPO connector 25 of FIG. 5. The associate identifier 712 also has an attachment point type of "REAR", which indicates that the MPO connector 25 is a rear attachment point for the MPO module 406. The associate identifier 712 also has a path index that has a value of "1", corresponding to internal optical connection 1 of FIG. 5.

The associate identifier 714 for LC connector 1 has an attachment point identifier that has a value of "1", which corresponds to LC connector 1 of FIG. 5. The associate identifier 714 also has an attachment point type of "FRONT", which indicates that the LC connector 1 is a front attachment point for the MPO module 406. The associate identifier 714 also has a path index that has a value of "1", corresponding to internal optical connection 1 of FIG. 5.

The port map 700 includes appropriate associations for each of the twenty four logical ports (and associated communication paths) of the MPO module 406 shown in FIG. 5. For example, as shown in FIG. 7, the port map 700 includes an association 716 for logical port 2, which is associated with LC connector 2 and MPO connector 25. Association 716 associates MPO connector 25 (identified by associate identifier 718) with LC connector 2 (identified by associate identifier 720). Similarly, the port map 700 includes an association 722 for logical port 24, which is associated with LC connector 24 and MPO connector 28. Association 722 associates MPO connector 28 (identified by associate identifier 724) with LC connector 24 (identified by associate identifier 726).

The port map 700 is stored in the storage device 446 (along with a module identifier for the particular module 406). Likewise, a logical device identifier for the particular MPO shelf 400 is stored in the storage device 407 included in the MPO shelf 400. As described in more detail below in connection with FIG. 8, the slave processor 412 associated with each MPO module 406 reads the port map 700 and module identifier and communicates it to the aggregation point 120, and the master processor 408 reads the logical device identifier and communicates to the aggregation point 120.

Each logical port (and communication path associated therewith) can be uniquely addressed in a manner that is unique within the context of the system of which the MPO module 406 is a part by appending to the respective logical port number a logical device identifier and an module identifier of the type described above in connection with FIGS. 6A-6B. For example, logical port 1 of the MPO module 406 shown in FIG. 5 (which is associated with LC connector 1) can be addressed by appending to the logical port number 1 the logical device identifier assigned to the MPO shelf 400 of FIG. 4 (the logical device identifier of "MPOSHELF1" in this example) and the module identifier assigned to MPO module 406 (the module identifier of "55555" in this example). In this way, a different port map 700 does not need to be generated for each MPO module 406 that is manufactured and, instead, the same port map 700 can be used for a particular model of MPO module.

One advantage of the scheme described in connection with FIG. 7 is that a technician or other person who is near the front of the MPO module 406 can identify a particular logical port by identifying the appropriate LC connector 404. The number (or other identifier) assigned to each LC connector 404 can be printed on the fascia of the MPO module 406 near that LC connector 404. As noted above, this number (or other identifier) is used as the port identifier for the logical port that is associated with that LC connector 404. Also, the logical device identifier assigned to the corresponding MPO shelf 400 can be printed on the MPO shelf 400, and the module identifier assigned to that MPO module 406 can be printed on the MPO module 406. As a result, the technician is able to identify a particular logical port by identifying the logical port identifier for the LC connector, the module identifier for the MPO module 406, and the logical device identifier for the MPO shelf 400 printed on the MPO module 406 and the MPO shelf 400.

Figure 8:
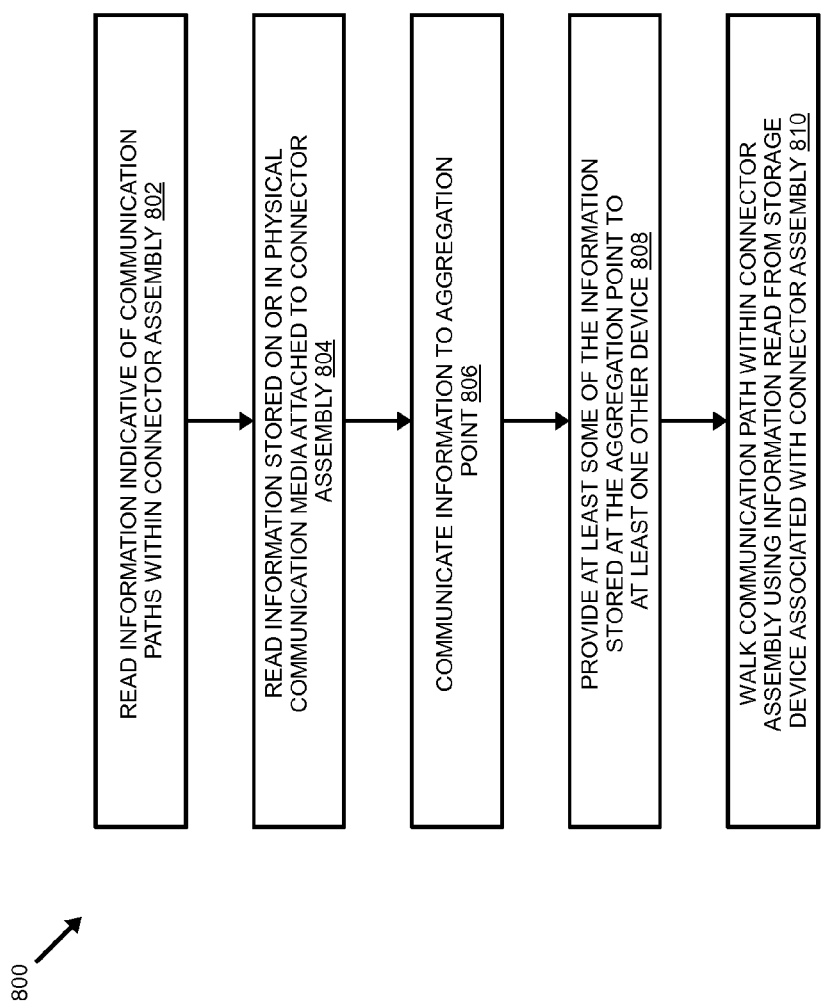
FIG. 8 is a flow diagram of an exemplary embodiment of a method of tracking a plurality of communication paths in a connector assembly.

FIG. 8 is a flow diagram of one exemplary embodiment of a method 800 of tracking a plurality of communication paths in a connector assembly. The exemplary embodiment shown in FIG. 8 is described here in connection with FIG. 8 as being implemented using the MPO shelf 400 and MPO module 406 shown in FIGS. 4 and 5 (though other embodiments can be implemented in other ways).

Method 800 comprises reading, from a storage device associated with the connector assembly, first information indicative of a plurality of communication paths formed within the connector assembly between the first attachment points and the second attachment points of the connector assembly (block 802). In one example, where the set 650 of associations shown in FIGS. 6A-6B are directly stored in the storage device 446 in the MPO module 406, the slave software 420 executing on the slave processor 412 associated with the MPO module 406 reads the set 650 of associations from the storage device 446. In another example where information indicative of the set 650 of associations shown in FIGS. 6A-6B is stored in the storage device 407 of the MPO shelf 400 and the storage device 446 of the MPO module 406 in compressed form, the master software 416 executing on the master processor 408 of the MPO shelf 400 reads, among other things, the logical device identifier assigned to the MPO shelf 600 and the slave software 420 executing on the slave processor 412 associated with the MPO module 406 reads from the storage device 446, for example, data that specifies the number and type of MPO modules, the number and type of LC modules, the number of LC modules that are associated with each MPO module (if it is not otherwise inferable from the type of MPO connector), and a numbering scheme for the logical ports and path indexes) and/or a port map of the type described above in connection with FIG. 7. This reading can be done when the MPO shelf 400 and/or MPO module 406 (more specifically, the master processor 408 and/or slave processor 412) are first powered on, periodically after initial power on, and/or in response to a request from another device (such as a master processor 408 or aggregation point 120).

Method 800 further comprises reading information stored on or in physical communication media that is attached to the connector assembly (block 804). More specifically, in the context of the MPO module 406 shown in FIG. 5, when an MPO connector 426 attached to one end of a trunk cable 428 is attached to one of the MPO connectors 402, the software 420 executing on the slave processor 412 learns of that fact and uses the corresponding media interface 424 to read the information stored in the storage device 444 associated with that MPO connector 426. Likewise, when an LC connector 434 attached to one end of fiber optic cable 436 is inserted into one of the LC connectors 404 of the MPO module 406, the software 420 executing on the slave processor 412 learns of that fact and uses the corresponding media interface 424 to read the information stored in the storage device 444 associated with that LC connector 434.

Method 800 further comprises communicating information read from the storage devices to an aggregation point that is communicatively coupled to the connector assembly (block 806). More specifically, in the context of the MPO module 406 shown in FIG. 5, the software 420 executing on the slave processor 412 in (or otherwise associated with) the MPO module 406 communicates the information it has read from the storage device 446 to the master processor 408 over the backplane 414. Also, the software 420 executing on the slave processor 412 in (or otherwise associated with) the MPO module 406 communicates the information it has read from any storage device 444 associated with an MPO or LC connector 426 or 434 to the master processor 408 over the backplane 414. The software 416 executing on the master processor 408 is configured to send at least some of this information to the aggregation point 120 over the network 118 to which the MPO module 406 is connected via the network interface 410. In some examples, the master software 416 also sends information it has read from the storage device 407 included in the MPO shelf 400 to the aggregation point 120.

Method 800 further comprises providing at least some of the information stored at the aggregation point to at least one other device (block 808). More specifically, in the context of the embodiment shown in FIGS. 4 and 5, application-layer functionality executing on a computer 136 (shown in FIG. 1) that is communicatively coupled to the aggregation point 120 via the network 118 can use the API provided by the aggregation point 120 to retrieve at least some of the information that was read from the storage devices 407, 444, and 446.

Method 800 further comprises walking a communication path within a connector assembly using at least some of the information read from the storage device associated with the connector assembly (block 810). More specifically, in the context of the embodiment shown in FIGS. 4 and 5, the application-layer functionality executing on the computer 136 (shown in FIG. 1) can use the set of associations that describe the communication paths through the MPO module 406 in order to walk that communication path. As used herein, "walking" a communication path refers to tracing and identifying the individual segments of physical communication media, connectors, and other attachment points that make up a given communication path. Walking a communication path can be done in connection with analyzing that communication path (for example, in connection with validating or troubleshooting the communication path).

The particular embodiments described above in connection with FIGS. 4-8 are merely exemplary. The techniques described here can be used with other types of connector assemblies and connectors. For example, although the embodiment described above with described in connection with simplex LC connectors (where each logical port comprises a single LC connector), it is to be understood that the techniques described here can be used in connector assemblies that make use of duplex LC connectors, where each logical port comprises two LC connectors.

Figure 9:
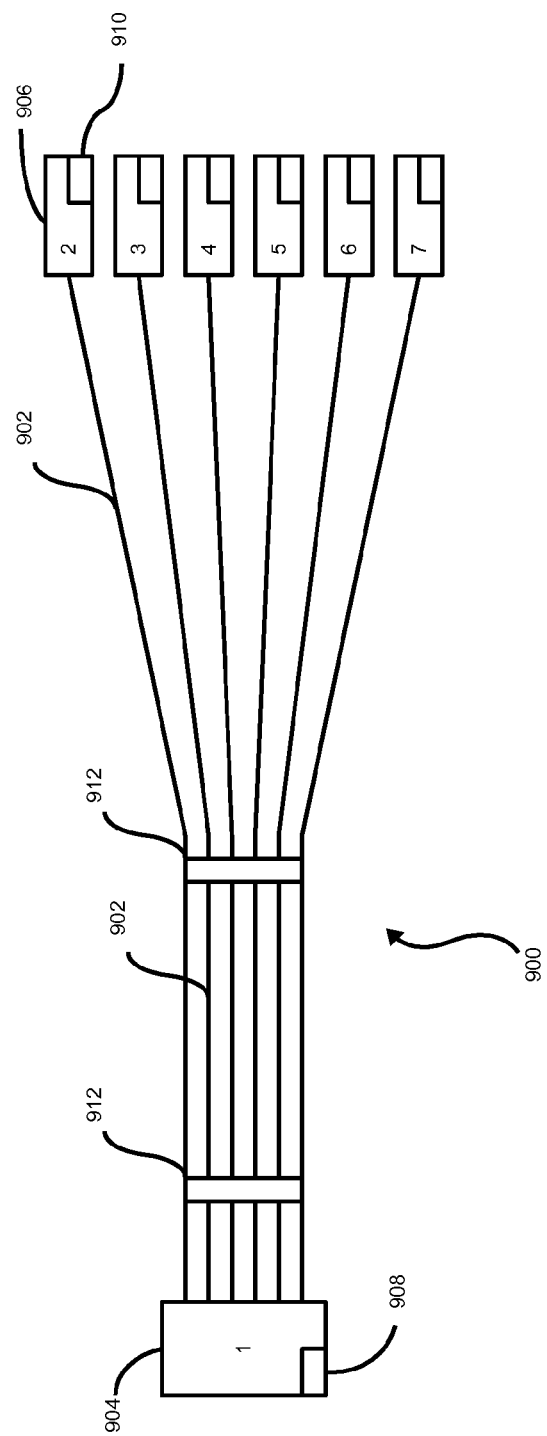
FIG. 9 is an exemplary embodiment of a fiber cable that includes multiple communication paths.

Similar techniques can be used to track communications paths that are formed within cables or other segments of physical communication media (collectively referred to as "cables" in the following description). One such example is shown in FIG. 9. FIG. 9 is an exemplary embodiment of a fiber cable 900 that includes multiple communication paths 902. In the embodiment shown in FIG. 9, the fiber cable 900 includes 6 communication paths 902. Each communication path 902 is implemented using a respective optical fiber. The fiber cable 900 includes a single MPO connector 904 at one end that terminates a respective end of all of the optical fibers. The fiber cable 900 also includes 6 LC connectors 906 at the other end of the fiber cable 900. Each LC connector 906 terminates the other end of a respective one of the optical fibers.

As noted above, each connector is used to terminate, at one end, one or more communication paths 902 (and the associated optical fibers that are used to implement such communication paths 902); each connector that is used to terminate the other end of each such communication path 902 (and the associated optical fiber) is also referred to here as an "opposite" connector. That is, all six of the LC connectors 906 are the opposite connectors for the MPO connector 904. Likewise, the MPO connector 904 is the opposite connector for each of the LC connectors 906.

In the exemplary embodiment shown in FIG. 9, the MPO connector 904 includes a storage device 908, and each LC connector 906 includes a respective storage device 910. The storage devices 908 and 910 are used to store information about the fiber cable 900 (and the MPO connector 904 and the LC connectors 906 that are a part thereof). The storage devices 908 and 910 and the connectors 904 and 906 are configured so that a respective media interface is able to read data from and/or write data to the storage devices 908 and 910 when the associated connector 904 or 906 is inserted into an appropriate port.

Also, in the exemplary embodiment shown in FIG. 9, the cable 900 includes one or more ties or clips 912 to hold the various optical fibers together along at least a portion of its length. In other embodiments, the optical fibers are held together in other ways or not at all.

The communication paths 902 in the fiber cable 900 can be tracked using the exemplary scheme described below in connection with FIG. 10.

FIG. 10 illustrates one example of a scheme for tracking the communication paths that exist within the fiber cable 900 of FIG. 9. Each storage device 908 or 910 is associated with a particular one of the connectors (either the MPO connector 904 or one of the LC connectors 906), where this associated connector is also referred to here as the "identified connector". In general, each storage device 908 or 910 is used to store data 1000 about the identified connector with which that storage device is associated. This data 1000 is also referred to here as "connector data" 1000.

The connector data 1000 includes a cable identifier 1002 that identifies the particular fiber cable 900 of which the identified connector is a part. In this example, each fiber cable 900 is assigned a cable identifier 1002 that uniquely identifies that particular cable within the particular system of interest.

The connector data 1000 also includes a connector identifier 1004 that identifies the particular identified connector associated with the storage device 908 or 910 in which that instance of the connector data 1000 is stored. The connector identifier 1004, in this example, can either be an identifier that is locally unique only with respect to the particular fiber cable 900 of which the identified connector is a part or be identifier that is globally unique within the particular system of interest.

The connector data 1000 also includes one or more connector identifiers 1006 that identify the one or more opposite connectors associated with that particular identified connector. These connector identifiers 1006 are also referred to here as the "opposite connector identifiers" 1006. In this example, the same identifier scheme used for the connector identifier 1004 is also used for the opposite connector identifiers 1006.

FIG. 10 also shows examples of the connector data for each of the connectors 904 and 906 of the fiber cable 900 shown in FIG. 9. In this example, the fiber cable 900 shown in FIG. 9 is assigned a cable identifier of "123456789", the MPO connector 904 is assigned a locally unique identifier of "1" (as also shown in FIG. 9), and the 6 LC connectors 906 are assigned ascending locally unique identifiers of "2" through "7" (as also shown in FIG. 9).

As shown in FIG. 10, the connector data 1008 for the MPO connector 904 of the fiber cable 900 includes a cable identifier 1010 of "123456789" and a connector identifier 1012 of "1". The connector data 1008 also includes six opposite connector identifiers 1014, one having a value of "2" corresponding to the LC connector assigned the connector identifier of "2", one having a value of "3" corresponding to the LC connector assigned the connector identifier of "3", one having a value of "4" corresponding to the LC connector assigned the connector identifier of "4", one having a value of "5" corresponding to the LC connector assigned the connector identifier of "5", one having a value of "6" corresponding to the LC connector assigned the connector identifier of "6", and one having a value of "7" corresponding to the LC connector assigned the connector identifier of "7".

The connector data 1016 for the LC connector 906 assigned the connector identifier of "2" includes a cable identifier 1018 of "123456789" and a connector identifier 1020 of "2". The connector data 1016 also includes one opposite connector identifier 1022 having a value of "1", which corresponds to the MPO connector 904. Similar connector data is provided for the other LC connectors 906.

When each of the connectors 904 and 906 is inserted into a port of a connector assembly or other device, the connector data stored in the associated storage device 908 or 910 is read and communicated to an aggregation point (or other entity) in the system. The aggregation point 120 (or other entity) is able to infer the communication paths 902 through the fiber cable 900 using the connector data read from the storage devices 908 and 910 since the connector data identifies both the identifier connector as well as the associated one or more opposite connectors for each connector 904 and 906. Alternatively, an explicit port map could be stored in, and read from, one or more of the storage devices 908 or 910.

Although an MPO/LC connector fiber cable is shown in FIGS. 9 and 10, it is to be understood that the scheme described above in connection with FIG. 10 can be used with any type of cable or segment of physical communication media including, for example, copper media, simplex cables, duplex cables, and other types of break out cables (including for example, MPO/LC fiber cables that include multiple MPO connectors as wells as multiple LC connectors).

Further details, embodiments, and implementations can be found in the following United States patent applications, all of which are hereby incorporated herein by reference: U.S. Provisional Patent Application Ser. No. 61/252,964, filed on Oct. 19, 2009, titled "ELECTRICAL PLUG FOR MANAGED CONNECTIVITY", U.S. Provisional Patent Application Ser. No. 61/253,208, filed on Oct. 20, 2009, titled "ELECTRICAL PLUG FOR MANAGED CONNECTIVITY", U.S. patent application Ser. No. 12/907,724, filed on Oct. 19, 2010, titled "MANAGED ELECTRICAL CONNECTIVITY SYSTEMS", U.S. Provisional Patent Application Ser. No. 61/303,948, filed on Feb. 12, 2010, titled "PANEL INCLUDING BLADE FEATURE FOR MANAGED CONNECTIVITY", U.S. Provisional Patent Application Ser. No. 61/413,844, filed on Nov. 15, 2010, titled "COMMUNICATIONS BLADED PANEL SYSTEMS", U.S. Provisional Patent Application Ser. No. 61/439,693, filed on Feb. 4, 2011, titled "COMMUNICATIONS BLADED PANEL SYSTEMS", U.S. patent application Ser. No. 13/025,730, filed on Feb. 11, 2011, titled "COMMUNICATIONS BLADED PANEL SYSTEMS", U.S. patent application Ser. No. 13/025,737, filed on Feb. 11, 2011, titled "COMMUNICATIONS BLADED PANEL SYSTEMS", U.S. patent application Ser. No. 13/025,743, filed on Feb. 11, 2011, titled "COMMUNICATIONS BLADED PANEL SYSTEMS", U.S. patent application Ser. No. 13/025,750, filed on Feb. 11, 2011, titled "COMMUNICATIONS BLADED PANEL SYSTEMS", U.S. Provisional Patent Application Ser. No. 61/303,961; filed on Feb. 12, 2010, titled "Fiber Plug And Adapter For Managed Connectivity", U.S. Provisional Patent Application Ser. No. 61/413,828, filed on Nov. 15, 2010, titled "Fiber Plugs And Adapters For Managed Connectivity", U.S. Provisional Patent Application Ser. No. 61/437,504, filed on Jan. 28, 2011, titled "Fiber Plugs And Adapters For Managed Connectivity", U.S. patent application Ser. No. 13/025,784, filed on Feb. 11, 2011, titled "Managed Fiber Connectivity Systems", U.S. patent application Ser. No. 13/025,788, filed on Feb. 11, 2011, titled "Managed Fiber Connectivity Systems", U.S. patent application Ser. No. 13/025,797, filed on Feb. 11, 2011, titled "Managed Fiber Connectivity Systems", U.S. patent application Ser. No. 13/025,841, filed on Feb. 11, 2011, titled "Managed Fiber Connectivity Systems", U.S. Provisional Patent Application Ser. No. 61/413,856, filed on Nov. 15, 2010, titled "CABLE MANAGEMENT IN RACK SYSTEMS", U.S. Provisional Patent Application Ser. No. 61/466,696, filed on Mar. 23, 2011, titled "CABLE MANAGEMENT IN RACK SYSTEMS", U.S. Provisional Patent Application Ser. No. 61/252,395, filed on Oct. 16, 2009, titled "MANAGED CONNECTIVITY IN ELECTRICAL SYSTEMS", U.S. patent application Ser. No. 12/905,689, filed on Oct. 15, 2010, titled "MANAGED CONNECTIVITY IN ELECTRICAL SYSTEMS", U.S. Provisional Patent Application Ser. No. 61/252,386, filed on Oct. 16, 2009, titled "MANAGED CONNECTIVITY IN FIBER OPTIC SYSTEMS", and U.S. patent application Ser. No. 12/905,658, filed on Oct. 15, 2010, titled "MANAGED CONNECTIVITY IN FIBER OPTIC SYSTEMS".

A number of embodiments of the invention defined by the following claims have been described. Nevertheless, it will be understood that various modifications to the described embodiments may be made without departing from the spirit and scope of the claimed invention. Accordingly, other embodiments are within the scope of the following claims.

What is claimed is:

1. A method of tracking a plurality of communication paths in a connector assembly having a plurality of first attachment points and a plurality of second attachment points, wherein each of the plurality of first attachment points and the plurality of second attachment points is configured to attach a respective cable to the connector assembly, the method comprising:
reading, from a first storage device associated with the connector assembly first, information indicative of a plurality of communication paths formed within the connector assembly between the first attachment points and the second attachment points, wherein at least one of the first attachment points is connected to more than one of the second attachment points, each of the more than one of the second attachment points is connected to the least one of the first attachment points via a respective communication path and wherein the first information includes information indicative of the respective communication path via which each of the more than one of the second attachment points is connected to the at least one of the first attachment points;
wherein each of the cables comprises a respective physical communication medium and a respective second storage device, wherein the method further comprises:
reading second information from the second storage devices when the associated cables are attached to the connector assembly; and
communicating the first and second information to an aggregation point that is communicatively coupled to the connector assembly.

2. The method of claim 1, further comprising storing the first and second information at the aggregation point.

3. The method of claim 1, further comprising providing at least some of the first and second information stored at the aggregation point to at least one other device.

4. The method of claim 3, wherein at least one other device comprises application-layer functionality executing on a computer communicatively coupled to the aggregation point.

5. The method of claim 1, further comprising identifying a communication path within the connector assembly using the first information read from the storage device associated with the connector assembly.

6. The method of claim 1, wherein the plurality of first attachment points comprise a plurality of multi-fiber push on (MPO) connectors.

7. The method of claim 1, wherein the plurality of second attachment points comprise a plurality of LC optical connectors.

8. The method of claim 7, wherein the LC connectors comprise at least one of simplex LC connectors and duplex LC connectors.

9. The method of claim 1, wherein each of the first attachment points comprises a respective set of internal attachment points; and
wherein the connector assembly further comprises a plurality of internal connections, wherein each internal connection connects a respective internal attachment point with a respective second attachment point.

10. The method of claim 9, wherein the first information comprises a set of associations for each communication path formed within the connector assembly, wherein each association associates a respective first attachment point with a respective second attachment point.

11. The method of claim 10, wherein each association identifies a path index that identifies a respective internal connection.

12. The method of claim 9, wherein the first information comprises a set of logical ports, where each logical port identifies: a respective second attachment point associated with that logical port; and a respective first attachment point associated with that logical port.

13. The method of claim 12, wherein each logical port is identified using an identifier associated with a respective second attachment point.

14. A connector assembly comprising:
a plurality of first connectors; and
a plurality of second connectors;
wherein each of the plurality of first connectors and the plurality of second connectors is configured to attach a respective cable to the connector assembly;
wherein a plurality of communication paths are formed within the connector assembly between the first connectors and the second connectors, wherein at least one of the first connectors is connected to more than one of the second connectors, each of the more than one of the second connectors is connected to the least one of the first connectors via a respective communication path;
wherein the connector assembly further comprises:
a first storage device in which first information indicative of the communication paths is stored, wherein the first information includes information indicative of the respective communication path via which each of the more than one of the second connectors is connected to the at least one of the first connectors; and
a processor configured to read second information from a second storage device associated with least one cable that is connected to at least one of the first connectors and the second connectors, wherein the at least one cable comprises a physical communication medium and the second storage device;
wherein the connector assembly is configured to communicate at least some of the first and second information to an aggregation point.

15. The connector assembly of claim 14, wherein the processor comprises a slave processor and wherein the connector assembly comprises a master processor that is communicatively coupled to the aggregation point, wherein the master processor is configured to send at least some of the first and second information to the aggregation point.

16. The connector assembly of claim 14, wherein the connector assembly comprises a multi-fiber push on (MPO) module.

17. The connector assembly of claim 14, wherein the connector assembly comprises a plurality of multi-fiber push on (MPO) modules.

18. The connector assembly of claim 14, wherein the first connectors comprise a plurality of multi-fiber push on (MPO) connectors.

19. The connector assembly of claim 14, wherein the second connectors comprise LC connectors.

20. The connector assembly of claim 19, wherein the LC connectors comprise at least one of simplex LC connectors and duplex LC connectors.

21. The connector assembly of claim 14, wherein each of the first connectors comprises a respective set of internal attachment points; and
wherein the connector assembly further comprises a plurality of internal connections, wherein each internal connection connects a respective internal attachment point with a respective second connector.

22. The connector assembly of claim 21, wherein the first information comprises a respective association for each communication path formed within the connector assembly, wherein each association associates a respective first connector with a respective second connector.

23. The connector assembly of claim 22, wherein each association comprises a path index that identifies a respective internal connection.

24. The connector assembly of claim 21, wherein the first information comprises a set of logical ports, where each logical port identifies: a respective second connector associated with that logical port and a respective first connector associated with that logical port.

25. The connector assembly of claim 24, wherein each logical port is identified using an identifier associated with respect second attachment point.

26. A multi-fiber push on (MPO) module comprising:
a plurality of multi-fiber push on (MPO) connectors; and
a plurality of LC fiber connectors;
wherein the plurality of MPO connectors are configured to attach a plurality of optical trunk cables to the MPO module;
wherein the plurality of LC connectors are configured to attach a plurality of optical cables to the MPO module; and
wherein a plurality of communication paths are formed within the MPO module between the MPO connectors and the LC connectors, wherein each of the MPO connectors is connected to more than one of the LC fiber connectors, each of the more than one of the LC fiber connectors is connected to the respective MPO connector via a respective communication path;
wherein the MPO module further comprises:
a first storage device in which first information indicative of the communication paths is stored, wherein the first information includes information indicative of the respective communication path via which each of the more than one of the LC fiber connectors is connected to the respective MPO connector; and
a processor configured to read second information from at least one second storage device associated with at least one trunk cable that is connected to at least one of the MPO connectors, the at least one trunk cable comprising respective physical communication media and the second storage device, and from at least one third storage device associated with at least one optical cable that is connected to at least one of the LC connectors, the at least one optical cable comprising a respective physical communication medium and the third storage device;
wherein at least some of the first and second information is communicated to an aggregation point.

27. The MPO module of claim 26, wherein the at least some of the first and second information is communicated to a master processor, which communicates the at least some of the first and second information to the aggregation point.

28. The MPO module of claim 26, wherein the LC connectors comprise at least one of simplex LC connectors and duplex LC connectors.

* * * * *